(12) United States Patent
Takahashi et al.

(10) Patent No.: US 12,220,732 B2
(45) Date of Patent: Feb. 11, 2025

(54) SUBSTRATE CLEANING SYSTEM AND SUBSTRATE CLEANING METHOD

(71) Applicant: EBARA CORPORATION, Tokyo (JP)

(72) Inventors: Hiroki Takahashi, Tokyo (JP); Kohei Sato, Tokyo (JP); Koichi Fukaya, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 92 days.

(21) Appl. No.: 17/783,069

(22) PCT Filed: Nov. 25, 2020

(86) PCT No.: PCT/JP2020/043805
§ 371 (c)(1),
(2) Date: Jun. 7, 2022

(87) PCT Pub. No.: WO2021/117485
PCT Pub. Date: Jun. 17, 2021

(65) Prior Publication Data
US 2023/0023260 A1    Jan. 26, 2023

(30) Foreign Application Priority Data

Dec. 11, 2019 (JP) ................... 2019-223429

(51) Int. Cl.
*B08B 1/10* (2024.01)
*B08B 1/20* (2024.01)
(Continued)

(52) U.S. Cl.
CPC ............ *B08B 3/08* (2013.01); *B08B 1/10* (2024.01); *B08B 1/20* (2024.01); *B08B 3/022* (2013.01);
(Continued)

(58) Field of Classification Search
None
See application file for complete search history.

(56) References Cited

U.S. PATENT DOCUMENTS

2008/0314870 A1* 12/2008 Inoue ............... H01L 21/67034
  118/58
2017/0117165 A1    4/2017 Kunisawa et al.

FOREIGN PATENT DOCUMENTS

JP    2002-043267 A    2/2002
JP    2002-100605 A    4/2002
(Continued)

OTHER PUBLICATIONS

Japanese Patent Office, International Search Report in International Patent Application No. PCT/JP2020/043805 (Feb. 2, 2021).
(Continued)

*Primary Examiner* — Levon J Shahinian
(74) *Attorney, Agent, or Firm* — Leydig, Voit & Mayer, Ltd.

(57) ABSTRACT

The present invention relates to a substrate cleaning system and a substrate cleaning method for cleaning a substrate. The substrate cleaning system (50) includes a heater (51), a chemical-liquid diluting module (52), and a cleaning module. A temperature of the diluted-chemical-liquid mixed by the chemical-liquid diluting module (52) is determined to be higher than normal a temperature and lower than a glass transition point of a cleaning member. The cleaning member scrubs the substrate (W) with the diluted chemical liquid having the determined temperature supplied to the substrate (W).

19 Claims, 19 Drawing Sheets

(51) Int. Cl.
*B08B 3/02* (2006.01)
*B08B 3/08* (2006.01)
*B08B 3/14* (2006.01)
*B08B 13/00* (2006.01)
*H01L 21/02* (2006.01)
*H01L 21/67* (2006.01)

(52) U.S. Cl.
CPC ................ *B08B 3/14* (2013.01); *B08B 13/00* (2013.01); *H01L 21/02057* (2013.01); *H01L 21/67046* (2013.01); *H01L 21/67051* (2013.01); *B08B 2203/007* (2013.01)

(56) References Cited

FOREIGN PATENT DOCUMENTS

| | | |
|---|---|---|
| JP | 2010-074191 A | 4/2010 |
| JP | 2015-023165 A | 2/2015 |
| JP | 2015-168035 A | 9/2015 |
| JP | 2015-201627 A | 11/2015 |
| JP | 5866227 B2 | 2/2016 |
| JP | 2016-167514 A | 9/2016 |
| WO | WO 2018/124211 A1 | 7/2018 |

OTHER PUBLICATIONS

Intellecutal Property Office of Signapore, Search Report issued in Singaporean Patent Application No. 11202250179B (Dec. 19, 2024).

\* cited by examiner

SUBSTRATE CLEANING SYSTEM AND SUBSTRATE CLEANING METHOD

TECHNICAL FIELD

The present invention relates to a substrate cleaning system and a substrate cleaning method for cleaning a substrate.

BACKGROUND ART

In a manufacture of semiconductor devices, a CMP apparatus for planarizing a surface of a substrate performs a polishing process on a front surface of the substrate using a suspension liquid (slurry) containing abrasive grains and a polishing agent, then performs a cleaning process of removing slurry adhering to the front surface and a back surface of the substrate with use of a cleaning liquid, and performs a drying process of removing droplets adhering to the front surface and the back surface of the substrate after the cleaning process.

If the cleaning process is not appropriate, a defect may occur in structure of devices, whereby the devices may have a defective characteristic. Therefore, it is necessary to select a method of the cleaning process capable of removing the slurry reliably in a short time without destroying or corroding the devices. Under such background, a scrub-cleaning process with a roll-shaped or pencil-shaped sponge member is mainly adopted, and cleaning liquids of various chemicals are used in combination as a supplementary role (see, e.g., patent document 1).

CITATION LIST

Patent Literature

Patent document 1: Japanese Patent No. 5866227
Patent document 2: Japanese laid-open patent publication No. 2002-43267
Patent document 3: Japanese laid-open patent publication No. 2010-74191

SUMMARY OF INVENTION

Technical Problem

The scrub-cleaning process described in the patent document 1 is mainly applied in a interconnect process (BEOL) that forms a multilayer interconnect containing Cu interconnect and a Low-k insulating film. In recent years, CMP (Chemical Mechanical Polishing) is widely applied in a transistor process (FEOL) that forms electrodes and plugs, due to necessity of increasing speed of logic devices and reducing cost of memory devices.

Since the FEOL is applied to smaller film thickness, finer interconnect width, and finer space between interconnects, than the BEOL, the cleaning performance for fine particles and molecular contamination must be improved. One promising solution is a cleaning method using acceleration of chemical action by heating a chemical liquid.

However, in the scrub-cleaning process described in the patent document 1, when the heated chemical liquid is supplied from a nozzle and the temperature of the chemical liquid is too high, a mechanical property of the sponge member may deteriorate due to the heat, and the cleaning effect would be lower than when only the chemical liquid at a room temperature is used.

Further, according to study by the inventors, the liquid temperature may drop at a periphery of the substrate due to a cooling action associated with a rotational movement of the substrate during the substrate cleaning, and the cleaning process cannot be performed at a desired liquid temperature. The study has shown a problem that a stable cleaning effect cannot be obtained due to the temperature drop.

Thus, a first object of the present invention is to provide a substrate cleaning system and a substrate cleaning method including a heated-chemical-liquid supply device which can provide an improved cleaning effect. A second object of the present invention is to provide a substrate cleaning apparatus and a substrate cleaning method capable of achieving high uniformity of liquid temperature over an entire surface, to be cleaned, of a substrate during a cleaning process.

Solution to Problem

In an embodiment, there is provided a substrate cleaning system comprising: a heater configured to heat pure water; a chemical-liquid diluting module configured to mix chemical liquid and the pure water heated by the heater at a predetermined volume ratio; and a cleaning module configured to clean a substrate, wherein the cleaning module comprises: a substrate holding device configured to hold the substrate; a cleaning member configured to contact the substrate and scrub the substrate; a chemical-liquid supply nozzle configured to supply chemical liquid having a determined temperature to the substrate; and a pure-water supply nozzle configured to supply the heated pure water to the substrate, wherein a temperature of the diluted chemical liquid mixed by the chemical-liquid diluting module is determined to be higher than a normal temperature thereof and lower than a glass transition point of the cleaning member, and the cleaning member is configured to scrub the substrate while the diluted chemical liquid having the determined temperature is supplied to the substrate.

In an embodiment, the substrate cleaning system further comprises: a chemical-liquid supply line to which the chemical-liquid supply nozzle is coupled; and a pure-water supply line to which the pure-water supply nozzle is coupled, wherein the heater is coupled to the pure-water supply line and arranged upstream of a coupling member in a flow direction of the pure water, the coupling member being configured to couple the chemical-liquid supply line to the pure-water supply line.

In an embodiment, a temperature of the pure water supplied from the pure-water supply nozzle is higher than the temperature of the diluted chemical liquid supplied from the chemical-liquid supply nozzle.

In an embodiment, the cleaning module comprises: a first filter arranged adjacent to the chemical-liquid supply nozzle and configured to capture foreign matter flowing through the chemical-liquid supply line; and a second filter arranged adjacent to the pure-water supply nozzle and configured to capture foreign matter flowing through the pure-water supply line.

In an embodiment, the chemical-liquid supply nozzle comprises a radial nozzle configured to supply the diluted chemical liquid to a region from a center of the substrate to a periphery of the substrate held by the substrate holding device.

In an embodiment, the chemical-liquid supply nozzle comprises: a first chemical-liquid supply nozzle configured to supply the diluted chemical liquid to a center of the substrate held by the substrate holding device; and a second chemical-liquid supply nozzle configured to supply the diluted chemical liquid to a periphery of the substrate held by the substrate holding device.

In an embodiment, the chemical-liquid supply nozzle comprises: a front-surface-side chemical-liquid supply nozzle configured to supply the diluted chemical liquid to a front surface of the substrate held by the substrate holding device; and a back-surface-side chemical-liquid supply nozzle configured to supply the diluted chemical liquid to a back surface of the substrate held by the substrate holding device.

In an embodiment, the cleaning module includes a heating device arranged adjacent to a periphery of the substrate held by the substrate holding device, and the heating device is arranged to heat the diluted chemical liquid present on the periphery of the substrate.

In an embodiment, there is provided a substrate cleaning system comprising: a chemical-liquid diluting module configured to mix chemical liquid and pure water at a predetermined volume ratio; a cleaning module configured to clean a substrate using a cleaning member configured to contact the substrate and using diluted chemical liquid supplied by the chemical-liquid diluting module; a flow-rate regulator configured to regulate flow rate of the diluted chemical liquid; a heater configured to heat at least one of the chemical liquid, the pure water, and the diluted chemical liquid; and a controller configured to control the heater and the flow-rate regulator such that a temperature of the diluted chemical liquid is higher than a normal temperature and lower than a glass transition point of the cleaning member when the diluted chemical liquid is supplied to the cleaning module.

In an embodiment, there is provided a substrate cleaning method comprising: heating pure water by a heater; mixing chemical liquid and the pure water heated by the heater at a predetermined volume ratio; determining a temperature of the mixed diluted-chemical-liquid to be higher than a normal temperature and lower than a glass transition point of a cleaning member which is configured to scrub a substrate; supplying the diluted chemical liquid having the determined temperature through a chemical-liquid supply nozzle to the substrate held by a substrate holding device; supplying the pure water, heated by the heater, through a pure-water supply nozzle to the substrate held by the substrate holding device; and scrubbing the substrate by the cleaning member while the diluted chemical liquid having the determined temperature is supplied to the substrate.

In an embodiment, pure water flowing through a pure-water supply line coupled to the pure-water supply nozzle is heated by the heater, and the chemical liquid is mixed with the pure water flowing through a chemical-liquid supply line, which is coupled to the pure-water supply line at a position downstream of the heater in a flow direction of the pure water.

In an embodiment, a temperature of the pure water supplied from the pure-water supply nozzle is higher than the temperature of the diluted chemical liquid supplied from the chemical-liquid supply nozzle.

In an embodiment, foreign matter flowing through the chemical-liquid supply line is captured by a first filter arranged adjacent to the chemical-liquid supply nozzle, and foreign matter flowing through the pure-water supply line is captured by a second filter arranged adjacent to the pure-water supply nozzle.

In an embodiment, the diluted chemical liquid is supplied to the substrate held by the substrate holding device using the chemical-liquid supply nozzle which is a radial nozzle configured to supply the diluted chemical liquid to a region from a center of the substrate to a periphery of the substrate held by the substrate holding device.

In an embodiment, the diluted chemical liquid is supplied to the substrate held by the substrate holding device using the chemical-liquid supply nozzle, and the chemical-liquid supply nozzle comprises a first chemical-liquid supply nozzle configured to supply the diluted chemical liquid to a center of the substrate held by the substrate holding device and a second chemical-liquid supply nozzle configured to supply the diluted chemical liquid to a periphery of the substrate held by the substrate holding device.

In an embodiment, the diluted chemical liquid is supplied to the substrate held by the substrate holding device using the chemical-liquid supply nozzle, and the chemical-liquid supply nozzle comprises a front-surface-side chemical-liquid supply nozzle configured to supply the diluted chemical liquid to a front surface of the substrate held by the substrate holding device and a back-surface-side chemical-liquid supply nozzle configured to supply the diluted chemical liquid to a back surface of the substrate held by the substrate holding device.

In an embodiment, the diluted chemical liquid present on a periphery of the substrate is heated by a heating device arranged adjacent to the periphery of the substrate held by the substrate holding device.

In an embodiment, there is provided a substrate cleaning system comprising: a heater configured to heat pure water to produce heated pure water; a chemical-liquid diluting module configured to mix chemical liquid and the heated pure water to produce heated chemical liquid; and a cleaning module configured to clean a substrate, wherein the cleaning module comprises: a substrate holding device configured to hold the substrate; a cleaning member configured to contact the substrate and scrub the substrate; a chemical-liquid supply nozzle configured to supply the heated chemical liquid to the substrate; a pure-water supply nozzle configured to supply pure water to the substrate; and an internal pipe coupled to the cleaning member and configured to supply heated fluid, which is the heated pure water or the heated chemical liquid, to the cleaning member, the internal pipe communicating with at least one of the heater and the chemical-liquid diluting module.

In an embodiment, the internal pipe is arranged inside the cleaning member and extends in a longitudinal direction of the cleaning member.

In an embodiment, the internal pipe has at least one aperture facing the cleaning member.

In an embodiment, the substrate cleaning system further comprises: a chemical-liquid supply line to which the chemical-liquid supply nozzle is coupled; a pure-water supply line to which the pure-water supply nozzle is coupled; and a heated-fluid delivery line coupled to the internal pipe, wherein the heater is coupled to the pure-water supply line, and the heated-fluid delivery line is coupled to at least one of the pure-water supply line and the chemical-liquid supply line.

In an embodiment, the cleaning member is a roll cleaning member having a cylindrical shape, and a longitudinal length of the cleaning member is longer than a diameter of the substrate.

In an embodiment, the cleaning member is a pencil cleaning member having a pencil shape, and the internal pipe is coupled to an upper part of the pencil cleaning member.

In an embodiment, there is provided a substrate cleaning system comprising: a heater configured to heat chemical liquid to produce heated chemical liquid; and a cleaning module configured to clean a substrate, wherein the cleaning module comprises: a substrate holding device configured to hold the substrate; a cleaning member configured to contact the substrate and scrub the substrate; a chemical-liquid supply nozzle configured to supply the heated chemical liquid to the substrate; a pure-water supply nozzle configured to supply pure water to the substrate; and an internal pipe coupled to the cleaning member and configured to supply the heated chemical liquid to the cleaning member, the internal pipe communicating with the heater.

In an embodiment, the internal pipe is arranged inside the cleaning member and extends in a longitudinal direction of the cleaning member.

In an embodiment, the internal pipe has at least one aperture facing the cleaning member.

In an embodiment, the substrate cleaning system further comprises: a chemical-liquid supply line to which the chemical-liquid supply nozzle is coupled; a pure-water supply line to which the pure-water supply nozzle is coupled; and a heated-fluid delivery line coupled to the internal pipe, the heater is coupled to the chemical-liquid supply line, and the heated-fluid delivery line is coupled to the chemical-liquid supply line.

In an embodiment, the cleaning member is a roll cleaning member having a cylindrical shape, and a longitudinal length of the cleaning member is longer than a diameter of the substrate.

In an embodiment, the cleaning member is a pencil cleaning member having a pencil shape, and the internal pipe is coupled to an upper part of the pencil cleaning member.

In an embodiment, there is provided a substrate cleaning method comprising: heating pure water by a heater to produce heated pure water; mixing chemical liquid and the heated pure water to produce heated chemical liquid; supplying heated fluid, which is the heated pure water or the heated chemical liquid, to a cleaning member through an internal pipe coupled to the cleaning member; and scrubbing a substrate by the cleaning member with the heated fluid supplied through the internal pipe to the cleaning member, while supplying the heated chemical liquid from a chemical-liquid supply nozzle to the substrate.

In an embodiment, in the scrubbing of the substrate, the cleaning member with the heated fluid permeating through the cleaning member is in contact with a center and a periphery of the substrate to supply the heated fluid to the center and the periphery of the substrate through the cleaning member.

In an embodiment, the substrate cleaning method further comprises supplying pure water from a pure-water supply nozzle to the substrate after the scrubbing of the substrate.

In an embodiment, there is provided a substrate cleaning method comprising: heating chemical liquid by a heater to produce heated chemical liquid; supplying the heated chemical liquid to a cleaning member through an internal pipe coupled to the cleaning member; and scrubbing a substrate by the cleaning member with the heated chemical liquid supplied through the internal pipe to the cleaning member, while supplying the heated chemical liquid from a chemical-liquid supply nozzle to the substrate.

In an embodiment, in the scrubbing of the substrate, the cleaning member with the heated chemical liquid permeating through the cleaning member is in contact with a center and a periphery of the substrate to supply the heated chemical liquid to the center and the periphery of the substrate through the cleaning member.

In an embodiment, the substrate cleaning method further comprises supplying pure water from a pure-water supply nozzle to the substrate after the scrubbing of the substrate.

Advantageous Effects of Invention

The substrate cleaning system supplies the diluted chemical liquid to the substrate, with the temperature of the diluted chemical liquid being higher than a normal temperature and lower than the glass transition point of the cleaning member. The cleaning member scrubs the substrate while the diluted chemical liquid is supplied to the substrate. Therefore, the substrate cleaning system can achieve an optimum cleaning effect.

Further, the substrate cleaning system supplies the heated fluid (heated pure water or heated chemical liquid) onto the surface, to be cleaned, of the substrate via the internal pipe and the cleaning member. Since the cleaning member contacts not only the central part of the substrate but also the periphery of the substrate, the heated fluid is supplied over the entire substrate without being subjected to a cooling action associated with a rotational movement of the substrate. Therefore, the substrate cleaning apparatus and the substrate cleaning method can achieve high uniformity of liquid temperature over the entire surface, to be cleaned, of the substrate during the cleaning process. As a result, the substrate cleaning apparatus and the substrate cleaning method can achieve a stable removal effect for particulate contamination, molecular contamination, and metal element contamination.

DESCRIPTION OF EMBODIMENTS

Figure 1:
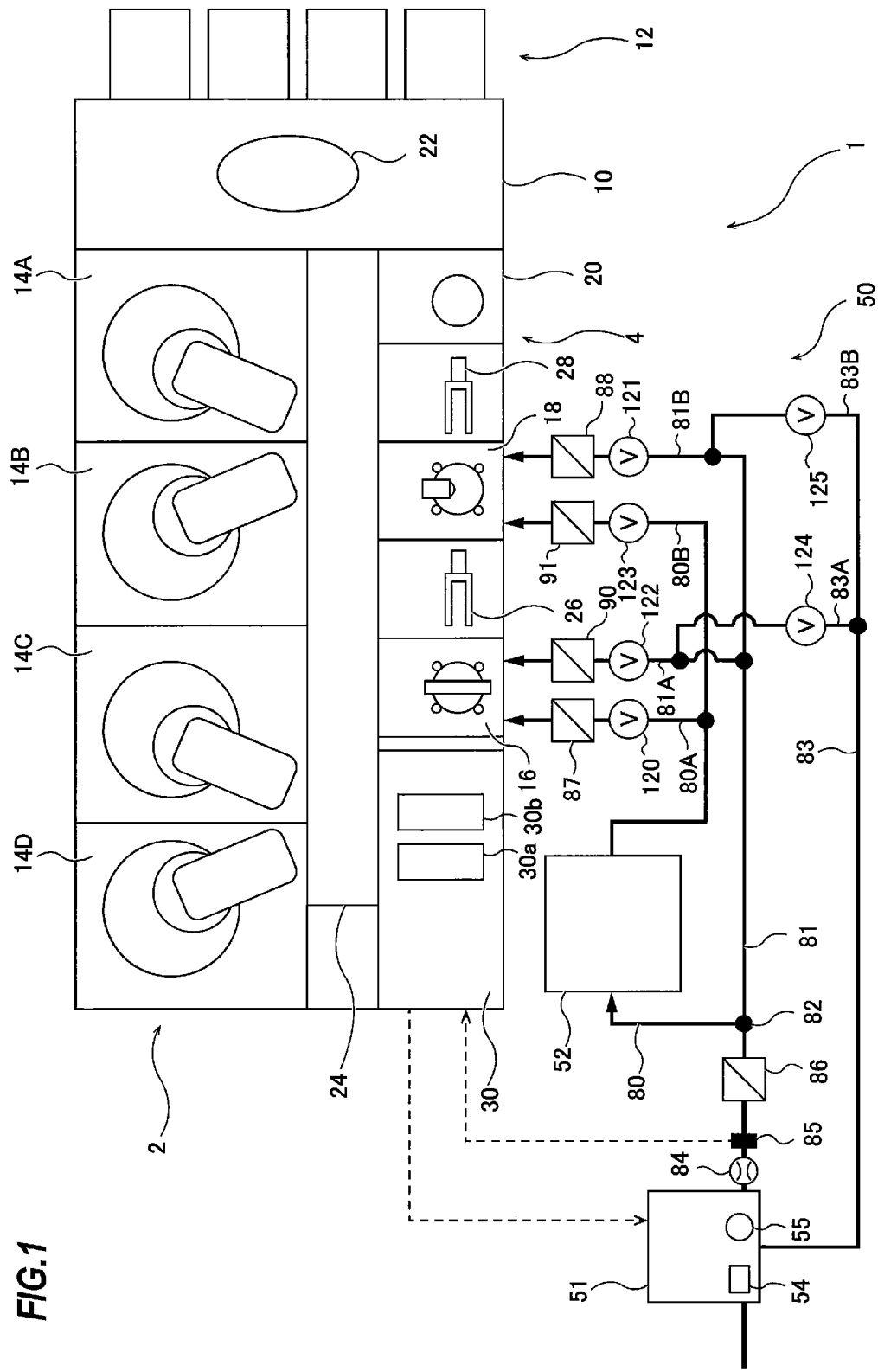
FIG. 1 is a plan view showing an entire structure of a substrate processing apparatus.

Embodiments of the present invention will now be described with reference to the drawings. Identical or corresponding structural elements are denoted by identical reference numerals and will not be described below repetitively.

Embodiments described below relate to a substrate cleaning method (and a substrate cleaning system) for cleaning a front surface (and back surface) of a substrate (particularly a semiconductor wafer), and more particularly to a substrate cleaning method performed in a substrate cleaning process of cleaning the surface of the substrate after polishing, such as CMP, of the substrate. This substrate cleaning method is also applied, e.g., to cleaning processes of manufacturing of flat panel, manufacturing of image sensor, such as CMOS or CCD, and manufacturing of magnetic film of MRAM.

Unless particularly described, "up" means a direction in which a cleaning tool is present starting from a substrate, and "under" means the opposite direction. With respect to the cleaning tool and components constituting the cleaning tool, "top surface" and "front surface" mean a surface on the side where the cleaning tool is in contact with the substrate. A central part of the substrate is a region including the center of the substrate. A periphery of the substrate is an annular region not including the center of the substrate, i.e., a region that surrounds the central part of the substrate. The periphery of the substrate is farther than the central part of the substrate viewed from the center of the substrate, and has a constant width along an outer-peripheral-end portion of the substrate W in the surface of the substrate W.

FIG. 1 is a plan view showing an entire structure of a substrate processing apparatus 1 (more specifically, a polishing apparatus) to which the above-described substrate cleaning method is applied. As shown in FIG. 1, the substrate processing apparatus 1 includes a housing 10 and a load port 12 on which substrate cassettes for storing a large number of substrates, such as semiconductor wafers, is placed. The load port 12 is arranged adjacent to the housing 10.

The substrate processing apparatus 1 includes a polishing section 2 and a cleaning section 4 arranged inside the housing 10. The polishing section 2 includes a plurality of (four in this embodiment) polishing modules 14A to 14D. The cleaning section 4 includes a first cleaning module 16 and a second cleaning module 18 each configured to clean a polished substrate, and a drying module 20 configured to drying a cleaned substrate. The polishing modules 14A to 14D are arranged along a longitudinal direction of the substrate processing apparatus 1. Similarly, the first cleaning module 16, the second cleaning module 18, and the drying module 20 are arranged along the longitudinal direction of the substrate processing apparatus 1.

The substrate processing apparatus 1 includes a first transfer robot 22 arranged adjacent to the load port 12 and a transfer module 24 arranged adjacent to the polishing modules 14A to 14D. The first transfer robot 22 receives a substrate, to be polished, from the load port 12 and delivers the substrate to the transfer module 24, and receives a dried substrate from the drying module 20 and returns the substrate to the load port 12. The transfer module 24 transports the substrate received from the first transfer robot 22 and transfers the substrate between the polishing modules 14A to 14D.

The substrate processing apparatus 1 includes a second transfer robot 26 arranged between the first cleaning module 16 and the second cleaning module 18, and a third transfer robot 28 arranged between the second cleaning module 18 and the drying module 20. The second transfer robot 26 transfers the substrate between the transfer module 24 and the cleaning modules 16 and 18. The third transfer robot 28 transfers the substrate between the modules 18 and 20.

The substrate processing apparatus 1 includes a controller 30 arranged inside the housing 10. The controller 30 is configured to control the operations of each device of the substrate processing apparatus 1. In the present embodiment, the controller 30 is configured to specifically control an operation of a substrate cleaning system 50, which will be described later.

Figure 2:
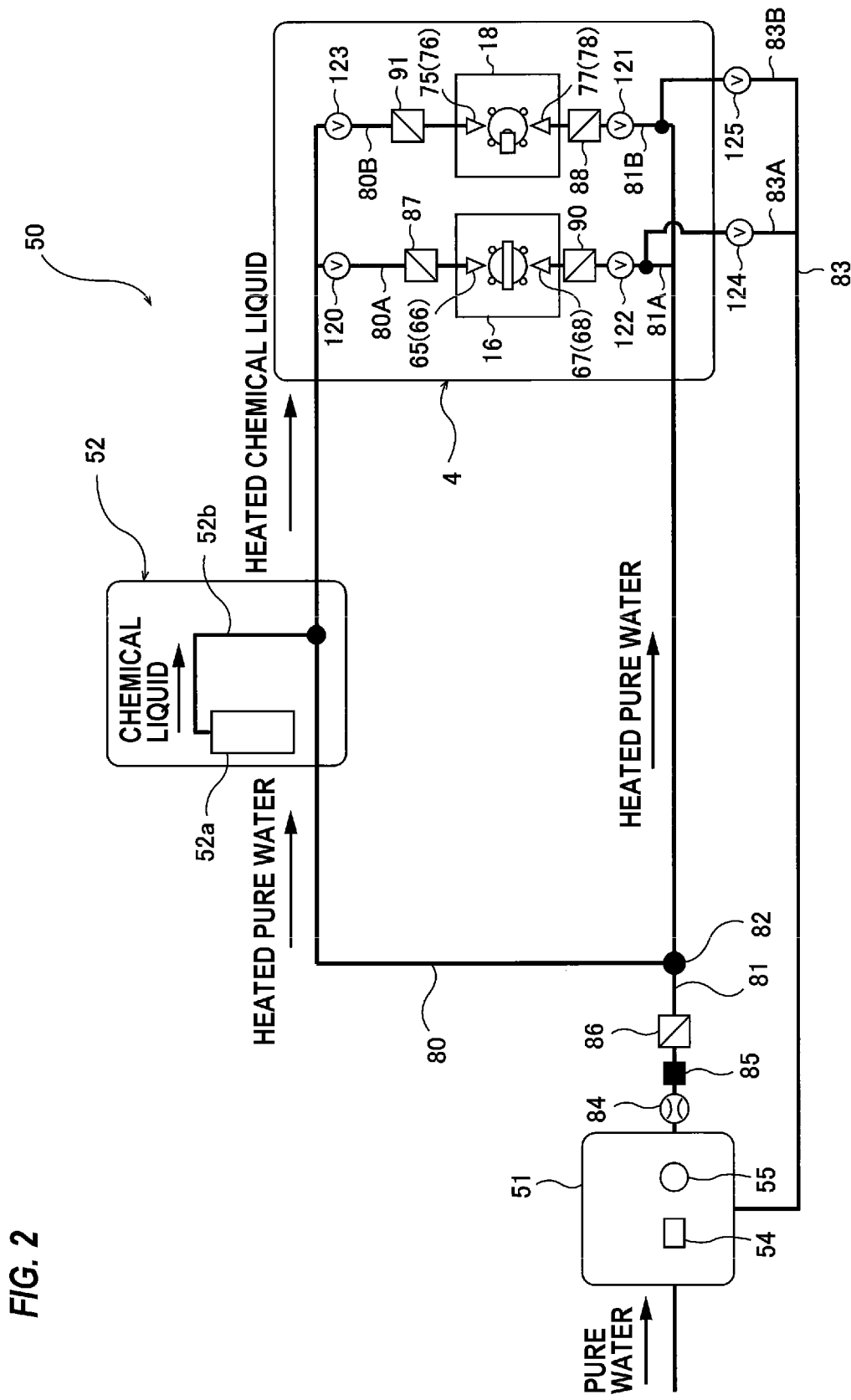
FIG. 2 is a diagram showing a substrate cleaning system.

FIG. 2 is a diagram showing the substrate cleaning system 50. The substrate processing apparatus 1 includes the substrate cleaning system 50. The substrate cleaning system 50 includes a heater 51 configured to heat pure water, a chemical-liquid diluting module (in other words, a chemical-liquid supply module) 52 configured to mix chemical liquid and the pure water heated by the heater 51 at a predetermined volume ratio, and the cleaning modules 16 and 18 each configured to clean the substrate. In the present embodiment, the substrate cleaning system 50 includes the first cleaning module 16 and the second cleaning module 18, while in one embodiment, the substrate cleaning system 50 may include any one of the first cleaning module 16 and the second cleaning module 18.

Figure 3:
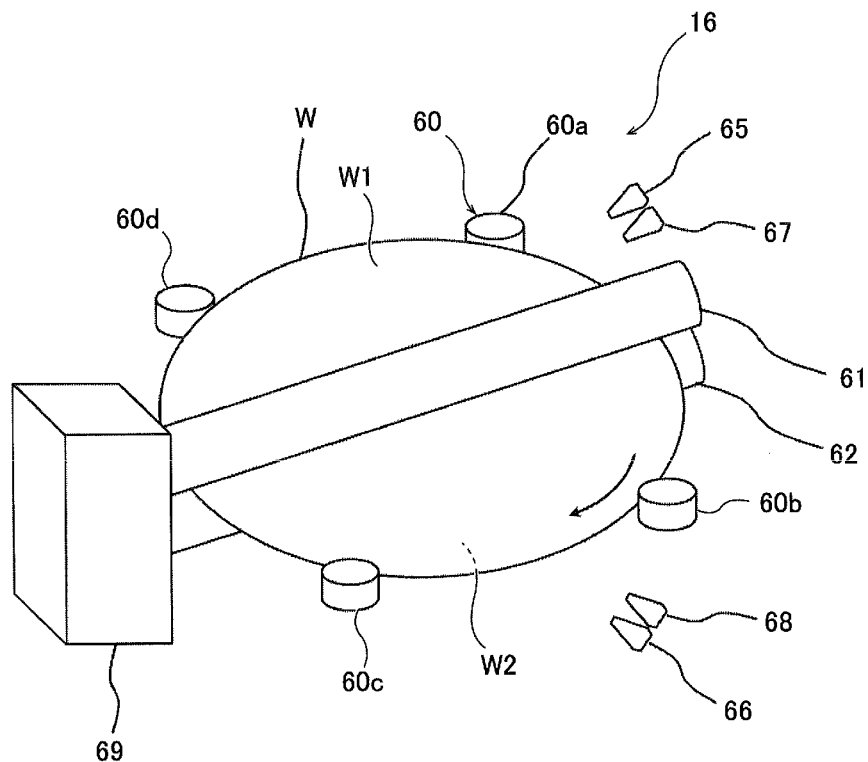
FIG. 3 is a diagram showing a first cleaning module.

FIG. 3 is a diagram showing the first cleaning module 16. As shown in FIG. 3, the first cleaning module 16 includes a substrate holding device 60 configured to rotate the substrate W while holding the substrate W, cleaning members 61 and 62 each configured to contact the substrate W and scrub the substrate W, chemical-liquid supply nozzles 65 and 66 configured to supply the chemical liquid having a determined temperature to a front surface W1 and a back surface W2 of the substrate W, and pure-water supply nozzles 67 and 68 configured to supply the heated pure water to the front surface W1 and the back surface W2 of the substrate W.

The chemical-liquid supply nozzle 65 is a front-surface-side chemical-liquid supply nozzle configured to supply the diluted chemical liquid to the front surface W1 of the substrate W. The chemical-liquid supply nozzle 66 is a back-surface-side chemical-liquid supply nozzle configured to supply the diluted chemical liquid to the back surface W2 of the substrate W. Similarly, the pure-water supply nozzle 67 is a front-surface-side pure-water supply nozzle configured to supply the pure water to the front surface W1 of the substrate W. The pure-water supply nozzle 68 is a back-surface-side pure-water supply nozzle configured to supply the pure water to the back surface W2 of the substrate W. The chemical-liquid supply nozzle 66 and the pure-water supply nozzle 68 not only provide the cleaning action on the back surface W2 of the substrate W but also prevent the temperature drop of the chemical liquid and the pure water on the front surface W1 of the substrate W by the heat transfer action thereof.

Each of the cleaning members 61 and 62 is a sponge member having a cylindrical shape and having a longitudinal length longer than a diameter of the substrate W. A material of the sponge member may preferably be a material having high hydrophilicity, e.g., PU (polyurethane) or PVA (polyvinyl alcohol). The cleaning members 61 and 62 are arranged such that a direction of central axes thereof are parallel to the surface of the substrate W (i.e., the front surface W1 and the back surface W2). Hereinafter, the cleaning member 61 may be referred to as an upper roll cleaning member 61, and the cleaning member 62 may be referred to as a lower roll cleaning member 62.

As shown in FIG. 3, the substrate holding device 60 includes four rollers 60a to 60d configured to horizontally hold and rotate the substrate W with the surface W1 of the substrate W facing upward. The rollers 60a to 60d are configured to be movable in directions closer to and away from each other by a not-shown drive mechanism (e.g., an air cylinder).

In the present embodiment, the substrate holding device 60 includes the rollers 60a to 60d as its components, but the substrate holding device 60 is not limited to the rollers as long as it can hold a side surface of the substrate W. Instead of the rollers, the substrate holding device 60 may include, for example, a plurality of clamps (not shown). The clamps are configured to be movable between a position for holding the periphery of the substrate W and a position separated from the substrate W.

In one embodiment, the substrate holding device 60 may be configured to hold the substrate W in a vertical direction. In this case, the rollers 60a to 60d (or clamps) are arranged vertically.

The first cleaning module 16 includes a rotating mechanism 69 configured to rotate the upper roll cleaning member 61 and the lower roll cleaning member 62. Each of the upper roll cleaning member 61 and the lower roll cleaning member 62 is supported by an elevating mechanism (not shown) and is movable in the vertical direction by the elevating mechanism. An example of the elevating mechanism includes a motor-driven mechanism using a ball screw or an air cylinder.

During loading and unloading of the substrate W, the upper roll cleaning member 61 and the lower roll cleaning member 62 are located away from each other. During cleaning of the substrate W, the upper roll cleaning member 61 and the lower roll cleaning member 62 move in directions closer to each other and come into contact with the front surface and the back surface of the substrate W. Thereafter, each of the upper roll cleaning member 61 and the lower roll cleaning member 62 is rotated by the rotating mechanism 69 to scrub the substrate W (scrub-cleaning).

Figure 4:
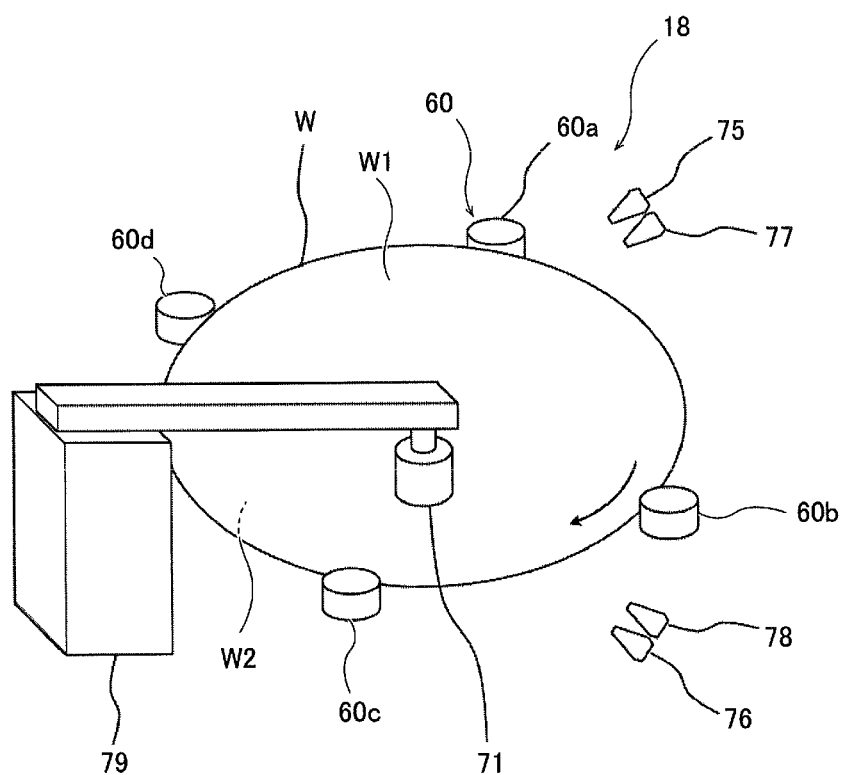
FIG. 4 is a diagram showing a second cleaning module.

FIG. 4 is a diagram showing the second cleaning module 18. As shown in FIG. 4, the second cleaning module 18 includes a substrate holding device 60 configured to rotate the substrate W while holding the substrate W, a cleaning member 71 configured to contact the substrate W and scrub the substrate W, chemical-liquid supply nozzles 75 and 76 configured to supply the chemical liquid having a determined temperature to the surface W1 and the back surface W2 of the substrate W, and pure-water supply nozzle 77 and 78 configured to supply the heated pure water to the front surface W1 and the back surface W2 of the substrate W.

The chemical-liquid supply nozzle 75 is a front-surface-side chemical-liquid supply nozzle configured to supply the diluted chemical liquid to the front surface W1 of the substrate W. The chemical-liquid supply nozzle 76 is a back-surface-side chemical-liquid supply nozzle configured to supply the diluted chemical liquid to the back surface W2 of the substrate W. Similarly, the pure-water supply nozzle 77 is a front-surface-side pure-water supply nozzle configured to supply the pure water to the front surface W1 of the substrate W. The pure-water supply nozzle 78 is a back-surface-side pure-water supply nozzle configured to supply the pure water to the back surface W2 of the substrate W.

The cleaning member 71 is a sponge member that has a pencil shape and contacts the surface W1 of the substrate W while rotating around a central axis of the cleaning member 71 to scrub the substrate W. Hereinafter, the cleaning member 71 may be referred to as a pencil cleaning member 71. The substrate holding device 60 includes four rollers 60a to 60d (or clamps) configured to hold and rotate the substrate W horizontally with the front surface W1 of the substrate W facing upward.

The second cleaning module 18 includes an oscillating mechanism 79 configured to oscillate the pencil cleaning member 71. The pencil cleaning member 71 is supported by an elevating mechanism (not shown), and is movable in the vertical direction by the elevating mechanism. An example of the elevating mechanism includes a motor-driven mechanism using a ball screw or an air cylinder.

The oscillating mechanism 79 is configured to oscillate the pencil cleaning member 71 in the radial direction of the substrate W. When the pencil cleaning member 71 is oscillating, the direction of the central axis of the pencil cleaning member 71 is perpendicular to the front surface W1 (or the back surface W2) of the substrate W.

In one embodiment, the oscillating mechanism 79 oscillates the pencil cleaning member 71 from the center of the substrate W to the periphery of the substrate W (one-way oscillation) while placing a lower surface of the rotating pencil cleaning member 71 in contact with the front surface W1 of the rotating substrate W with a predetermined pressing force. In another embodiment, the oscillating mechanism 79 oscillates the pencil cleaning member 71 from the periphery of the substrate W via the center of the substrate W to the periphery of the substrate W (reciprocating oscillation) while placing the lower surface of the rotating pencil cleaning member 71 in contact with the front surface W1 of the rotating substrate W with a predetermined pressing force. In this manner, the pencil cleaning member 71 scrubs the substrate W (scrub-cleaning).

As described above, when the roll cleaning member 61 and the lower roll cleaning member 62 are scrubbing the substrate W, the first cleaning module 16 supplies the chemical liquid onto the front surface W1 and the back surface W2 of the substrate W by the chemical-liquid supply nozzles 65 and 66. The chemical liquid is, for example, an alkaline cleaning liquid. Specifically, an aqueous solution containing any one of ammonia, a primary amine, a secondary amine, a tertiary amine, and a quaternary ammonium compound as a component is suitable. Similarly, when the pencil cleaning member 71 is scrubbing the substrate W, the second cleaning module 18 supplies the chemical liquid (e.g., an alkaline cleaning liquid) onto the front surface W1 and the back surface W2 of the substrate W by the chemical-liquid supply nozzles 75 and 76. Hereinafter, the chemical-liquid supply devices of supplying the chemical liquid onto the substrate W will be described with reference to FIG. 2.

As shown in FIG. 2, the substrate cleaning system 50 includes a chemical-liquid supply line 80 coupled to the chemical-liquid supply nozzles 65 and 66 and the chemical-liquid supply nozzles 75 and 76, a pure-water supply line 81 coupled to the pure-water supply nozzles 67 and 68 and the pure-water supply nozzles 77 and 78, and a pure-water return line 83 configured to circulate the pure water from the pure-water supply line 81 to the heater 51.

The heater 51 is coupled to the pure-water supply line 81. The chemical-liquid supply line 80 is coupled to the pure-water supply line 81, and is arranged downstream of the heater 51 in the flow direction of the pure water flowing through the pure-water supply line 81. The chemical-liquid supply line 80 is coupled to the pure-water supply line 81 by a coupling member 82. Therefore, the heater 51 is arranged upstream of the coupling member 82 in the flow direction of the pure water.

The heater 51 heats the pure water flowing through the pure-water supply line 81 to a predetermined temperature. More specifically, a flow-rate sensor 84 and a temperature sensor 85 are disposed adjacent to the heater 51 at positions downstream of the heater 51. The controller 30 (see FIG. 1) is electrically connected to the flow-rate sensor 84 and the temperature sensor 85. The controller 30 is configured to control the operation of the heater 51 such that the pure water flowing through the pure-water supply line 81 has a predetermined temperature and the pure water flows through the pure-water supply line 81 at a predetermined flow rate, based on a temperature data transmitted from the temperature sensor 85.

In the embodiment shown in FIG. 1, the heater 51 includes therein a heating element 54 configured to heat the pure water flowing through the pure-water supply line 81 and a flow-rate regulator 55 configured to regulate the flow rate of the pure water flowing through the pure-water supply line 81. The heating element 54 includes, for example, an infrared irradiation-type heater. Specifically, types of the heating element 54 include a halogen heater, a carbon heater, a ceramic heater, a quartz-tube heater, etc. The heater may be a known heating device, such as electric heating (resistance, arc, induction, dielectric (microwave), infrared ray, laser, heat pump), light, hot air, burner, etc., as long as the heater can satisfy a required installation environment, a start-up time, and a temperature condition, and can maintain the temperature. The heater may use hot water supplied from a factory where the heater is installed.

In the embodiment shown in FIG. 1, the heater 51 heats the pure water flowing through the pure-water supply line 81 and regulates the flow rate of the pure water. In one embodiment, the heater 51 may be disposed downstream of the chemical-liquid diluting module 52. In this case, the heater 51 heats the diluted chemical liquid and regulates the flow rate of the diluted chemical liquid. In another embodiment, the heater 51 may be disposed in a chemical-liquid coupling line 52b (described later). In this case, the heater 51 heats raw chemical-liquid and regulates the flow rate of the raw chemical-liquid. In this manner, the heater 51 is configured to heat at least one of the pure water, the diluted chemical liquid, and the raw chemical-liquid, and regulate the flow rate of at least one of the pure water, the diluted chemical liquid, and the raw chemical-liquid. In the embodiment shown in FIG. 1, the single heater 51 is provided, but the number of heaters 51 is not limited to this embodiment. A plurality of heaters 51 may be provided.

In one embodiment, the flow-rate regulator 55 may be provided as a separate component independently of the heater 51. In this case, the flow-rate regulator 55 may be disposed in any of the chemical-liquid supply line 80, the pure-water supply line 81, and the chemical-liquid coupling line 52b. The number of flow-rate regulators 55 is also not limited to this embodiment. A plurality of flow-rate regulators 55 may be provided.

In one embodiment, the heater 51 may be a heating device having the flow-rate sensor 84 and the temperature sensor 85 incorporated therein. In another embodiment, the substrate cleaning system 50 may further include flow sensors (not shown) and temperature sensors (not shown) disposed adjacent to the chemical-liquid supply nozzles 65, 66, 75, and 76 and the pure-water supply nozzles 67, 68, 77, and 78. The number of temperature sensors may correspond to the number of pure-water supply nozzles and the number of chemical-liquid supply nozzles.

The pure water heated to a predetermined temperature by the heater 51 flows through the pure-water supply line 81. Thereafter, the heated pure water branches off from the pure-water supply line 81 into the pure-water supply line 81 and the chemical-liquid supply line 80.

The chemical-liquid diluting module 52 is coupled to the chemical-liquid supply line 80. More specifically, the chemical-liquid diluting module 52 includes a chemical-liquid supply source 52a and the chemical-liquid coupling line 52b configured to couple the chemical-liquid supply source 52a to the chemical-liquid supply line 80.

The chemical-liquid diluting module 52 supplies the raw chemical-liquid having a normal temperature from the chemical-liquid supply source 52a through the chemical-liquid coupling line 52b into the chemical-liquid supply line 80 to add the raw chemical-liquid to the heated pure water flowing through the chemical-liquid supply line 80. In this manner, the chemical-liquid diluting module 52 mixes the raw chemical-liquid having a normal temperature and the heated pure water at a predetermined volume ratio to dilute the raw chemical-liquid with the heated pure water. Therefore, the temperature of the pure water supplied from the pure-water supply nozzles 67, 68, 77, and 78 is higher than the temperature of the diluted chemical liquid supplied from the chemical-liquid supply nozzles 65, 66, 75, and 76.

The temperature of the diluted chemical liquid mixed by the chemical-liquid diluting module 52 is determined to be a temperature higher than a normal temperature and lower than glass transition points of the cleaning members 61 and 62 (and/or the cleaning member 71). The reason for this is as follows. The temperature of the diluted chemical liquid is preferably higher than a normal temperature and lower than 100° C., which is the boiling point of water, in order to improve the cleaning effect on the substrate W, in other words, from the viewpoint of promoting the chemical action.

However, when the substrate W is scrub-cleaned while the heated chemical liquid is supplied, it is necessary to consider a heat resistance of the cleaning member (reference numeral omitted). As described above, the cleaning member is constituted by a sponge member. A material of the sponge member is generally a thermoplastic resin. Therefore, a glass transition point is in a temperature range lower than a melting point.

The glass transition point is a temperature at which a resin is in a state between a hard glass-like state and a soft rubber-like state. A modulus of elasticity is significantly lowered at a higher temperature than this glass transition point. Specifically, a rigidity of the sponge member is reduced, and as a result, the scrubbing action of the sponge member is lowered. Therefore, it is desirable that the temperature of the chemical liquid during the scrub-cleaning be higher than a normal temperature and lower than the glass transition point of the sponge member. For example, when the sponge member is a polyvinyl alcohol (PVA) resin, its glass transition point is about 60° C.

In the present embodiment, the cleaning members 61 and 62 (and/or cleaning member 71) scrub the substrate W while the heated chemical liquid having a determined temperature higher than a normal temperature and lower than the glass transition point of the cleaning members 61 and 62 (and/or the cleaning member 71) is supplied onto the substrate W.

The glass transition point may vary depending on a type of cleaning member used. Thus, the controller 30 may store a glass transition point corresponding to a cleaning member in a memory 30a for each type of the cleaning member. The controller 30 includes a processer 30b configured to perform arithmetic operations based on the data stored in the memory 30a. The memory 30a is a component of the controller 30. The controller 30 controls the temperature of the heated chemical liquid based on the cleaning member used and the glass transition point stored in the memory 30a.

According to the above-described embodiments, the scrubbing action is not lowered due to the deterioration of the mechanical property of the sponge member, and the chemical action (e.g., a decrease in surface tension, a decrease in kinematic viscosity, dissolution of organic substance) is promoted by the heating of the chemical liquid. As a result, the substrate cleaning system 50 can achieve a high cleaning effect on the substrate W. When the substrate W is rinsed without the scrub-cleaning, the temperature of the heated chemical liquid may be higher than the glass transition point.

As shown in FIG. 2, a filter 86 configured to capture foreign matter mixed in the pure water flowing through the pure-water supply line 81 is disposed upstream of the coupling member 82. When the pure water heated by the heater 51 flows through the pure-water supply line 81, foreign matter adhering to an inner wall of the pure-water supply line 81 may be peeled off by the heated pure water. In such a case, the peeled foreign-matter flows through the pure-water supply line 81 (and the chemical-liquid supply line 80) and is supplied onto the substrate W. In the present embodiment, since the substrate cleaning system 50 includes the filter 86 arranged next to the heater 51, the filter 86 can prevent the foreign matter from being supplied onto the substrate W.

In order to more reliably prevent the foreign matter from being supplied onto the substrate W, the substrate cleaning system 50 may include a filter 87 arranged adjacent to the pure-water supply nozzle 67 and a filter 88 arranged adjacent to the pure-water supply nozzle 77. Although not shown, the substrate cleaning system 50 may include filters arranged adjacent to the pure-water supply nozzles 68 and 78.

Similarly, the substrate cleaning system 50 may include a filter 90 arranged adjacent to the chemical-liquid supply nozzle 65 and a filter 91 arranged adjacent to the chemical-liquid supply nozzle 75. Although not shown, the substrate cleaning system 50 may include filters arranged adjacent to the chemical-liquid supply nozzles 66 and 76.

An on-off valve 120 is disposed upstream of the filter 87, an on-off valve 121 is disposed upstream of the filter 88, an on-off valve 122 is disposed upstream of the filter 90, and an on-off valve 123 is disposed upstream of the filter 91. Each of these on-off valves 120, 121, 122, and 123 is electrically connected to the controller 30. Therefore, the controller 30 supplies the pure water and/or the chemical liquid onto the substrate W by operating each of the on-off valves 120, 121, 122, and 123.

More specifically, the chemical-liquid supply line 80 includes a first chemical-liquid branch line 80A to which the filter 87 and the on-off valve 120 are attached, and a second chemical-liquid branch line 80B to which the filter 91 and the on-off valve 123 are attached. Similarly, the pure-water supply line 81 includes a first pure-water branch line 81A to which the filter 90 and the on-off valve 122 are attached, and a second pure-water branch line 81B to which the filter 88 and the on-off valve 121 are attached.

As shown in FIG. 2, the pure-water return line 83 is coupled to the pure-water supply line 81 and the heater 51. The pure-water return line 83 is provided as a heat retaining device for preventing the temperature drop of the pure water present in the pure-water supply line 81 during a standby of the cleaning section 4. By providing the pure-water return line 83, the temperature of the pure water present in the pure-water supply line 81 can be maintained at a constant temperature. Therefore, the pure water is returned to the heater 51 through the pure-water supply line 81 and the pure-water return line 83 during the standby of the cleaning section 4, such as during the processing of the substrate W in the polishing section 2. As a result, the pure water flowing through the pure-water supply line 81 is maintained at a constant temperature.

The pure-water return line 83 includes a first return branch line 83A coupled to the first pure-water branch line 81A and provided with an on-off valve 124, and a second return branch line 83B coupled to the second pure-water branch line 81B and provided with an on-off valve 125.

Each of the on-off valves 124 and 125 is electrically connected to the controller 30. During the standby of the cleaning section 4, the controller 30 opens the on-off valves 124 and 125 and closes the on-off valves 120, 121, 122, and 123. With such operations, the pure water circulates through the pure-water supply line 81, the pure-water return line 83, and the heater 51. As a result, the circulating pure water is maintained at a constant temperature. During the operation of the cleaning section 4, the controller 30 closes the on-off valves 124 and 125 and opens the on-off valves 120, 121, 122, and 123.

Figure 5:
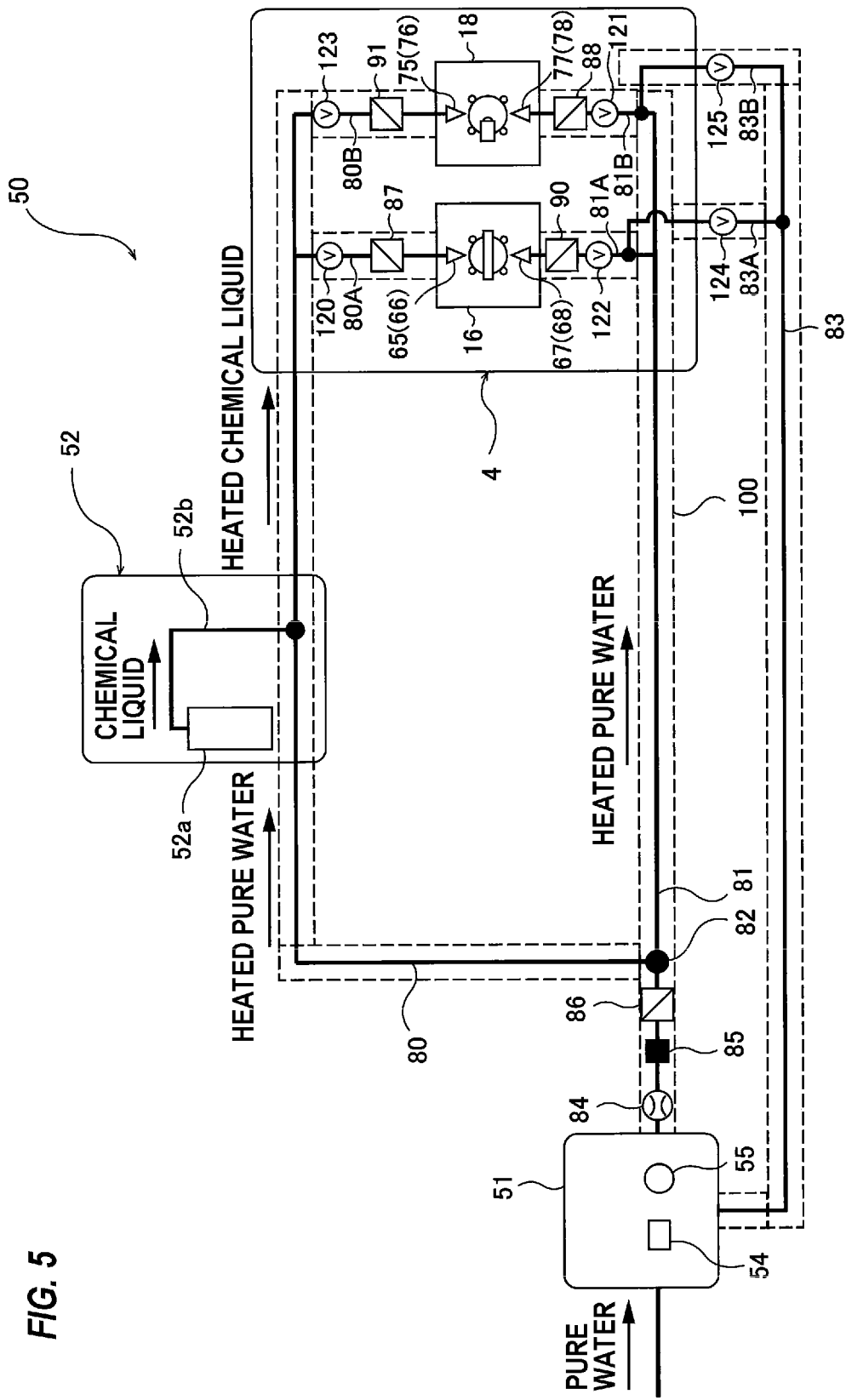
FIG. 5 is a diagram showing another embodiment of the substrate cleaning system.

FIG. 5 is a diagram showing another embodiment of the substrate cleaning system 50. In the present embodiment, identical or corresponding members are denoted by identical reference numerals as those in the above-described embodiment and will not be described below repetitively.

As shown in FIG. 5, the substrate cleaning system 50 may include a heat insulating member 100 covering the chemical-liquid supply line 80 and the pure-water supply line 81. The heat insulating member 100 can minimize the temperature drop of the heated chemical liquid flowing through the chemical-liquid supply line 80 and the temperature drop of the heated pure water flowing through the pure-water supply line 81. As a result, each of the heated pure water and the heated chemical liquid reaches each of the first cleaning module 16 and the second cleaning module 18, while the heated pure water and the heated chemical liquid maintain their temperatures. In this way, by providing the heat insulating member 100, the thermal efficiency of the heater 51 can be increased.

As described above, by supplying the heated chemical liquid onto the substrate W, the chemical action of the chemical liquid is promoted, and the cleaning effect on the substrate W can be increased. In order to uniformly supply the heated chemical liquid to the entire substrate W, the heated chemical liquid is supplied onto the center of the rotating substrate W. Ther centrifugal force due to the rotating substrate W acts on the heated chemical liquid supplied onto the center of the substrate W, and the heated chemical liquid spreads from the center of the substrate W toward the periphery of the substrate W in the radially outward directions of the substrate W.

In the present embodiment, the supply position of the heated chemical liquid is fixed, while in one embodiment, the chemical-liquid supply nozzle 65 (and/or the chemical-liquid supply nozzle 66) may supply the heated chemical liquid onto the substrate W while the chemical-liquid supply nozzle 65 (and/or the chemical-liquid supply nozzle 66) oscillate between the center of the substrate W and the periphery of the substrate W.

Therefore, the temperature of the heated chemical liquid on the periphery of the substrate W may be lower than the temperature of the heated chemical liquid on the center of the substrate W. As a result, the cleaning effect on the periphery of the substrate W may be lower than the cleaning effect on the center of the substrate W. Thus, the first cleaning module 16 (and the second cleaning module 18) may have a configuration which maintains the heated chemical liquid on the periphery of the substrate W at the same temperature as the temperature of the heated chemical liquid on the center of the substrate W.

Figure 6:
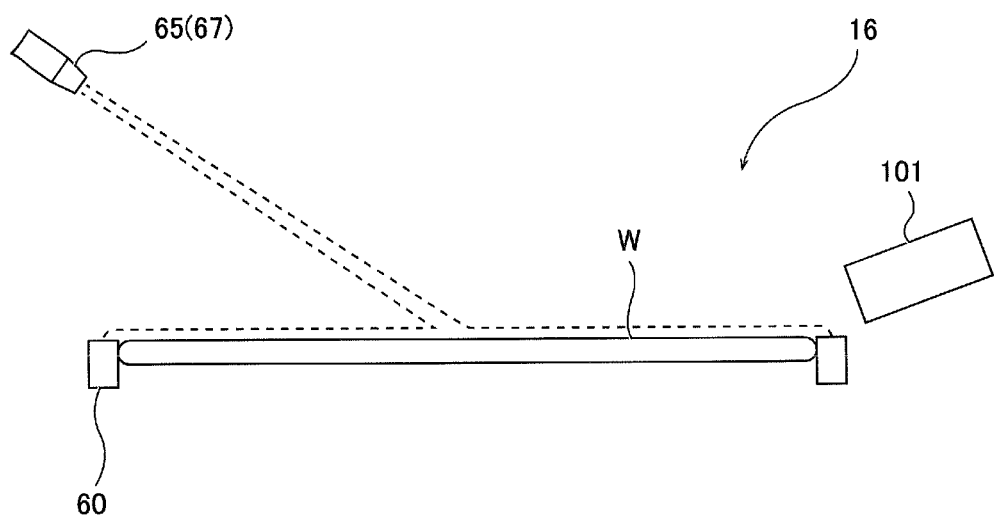
FIG. 6 is a diagram showing a heater disposed adjacent to a periphery of a substrate W.

FIG. 6 is a diagram showing a heater 101 disposed adjacent to the periphery of the substrate W. In the embodiment shown in FIG. 6, the heater 101 is provided in the first cleaning module 16, but the heater 101 may be provided in the second cleaning module 18. As shown in FIG. 6, the cleaning module 16 may include the heater 101 arranged adjacent to the periphery of the substrate W.

The heater 101 is a heating device configured to heat the heated chemical liquid (and the heated pure water) present on the periphery of the substrate W. The heater 101 can maintain the heated chemical liquid (and the heated pure water) on the periphery of the substrate W at the same temperature as the temperature of the heated chemical liquid (heated pure water) on the center of the substrate W. Therefore, the cleaning effect on the periphery of the substrate W can be improved.

Figure 7:
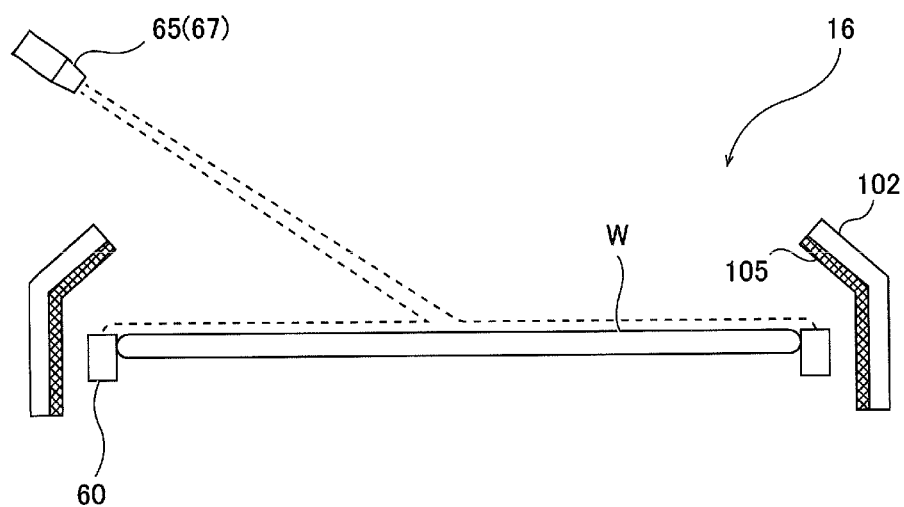
FIG. 7 is a diagram showing a liquid-splash prevention cup disposed adjacent to the periphery of the substrate.

FIG. 7 is a diagram showing a liquid-splash prevention cup 102 disposed adjacent to the periphery of the substrate W. As shown in FIG. 7, the first cleaning module 16 may include a heater 105 arranged inside the liquid-splash prevention cup 102. The liquid-splash prevention cup 102 is a member configured to receive the liquid splashed from the substrate W to prevent the splash of the liquid.

The heater 105 is attached to an inner circumferential surface of the liquid-splash prevention cup 102 and surrounds the substrate W. The heater 105 mounted to the liquid-splash prevention cup 102 can maintain the heated chemical liquid (and heated pure water) on the periphery of the substrate W at the same temperature as the temperature of the heated chemical liquid (heated pure water) on the center of the substrate W. Therefore, the cleaning effect on the periphery of the substrate W can be improved.

Figure 8:
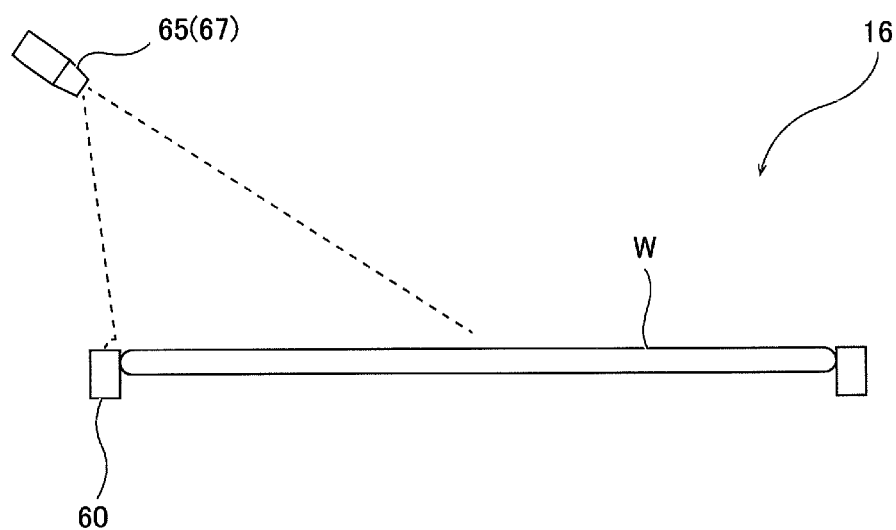
FIG. 8 is a diagram showing another embodiment of a chemical-liquid supply nozzle.

FIG. 8 is a diagram showing another embodiment of the chemical-liquid supply nozzle 65 (and the pure-water supply nozzle 67). As shown in FIG. 8, the chemical-liquid supply nozzle 65 (and the pure-water supply nozzle 67) may be a radial nozzle configured to supply the heated diluted chemical liquid to a region from the center to the periphery of the substrate W held by the substrate holding device 60. The radial nozzle is preferably a nozzle which is such that a cross section of a spray pattern on the surface of the substrate W has substantially a circular area, an elliptical area, or a flat area. Examples of the radial nozzle include a fan-shaped nozzle or a conical nozzle.

The chemical-liquid supply nozzle 65, which is a radial nozzle, can supply the chemical liquid uniformly over a region from the center of the substrate W to the periphery of the substrate W. Therefore, the chemical-liquid supply nozzle 65 can maintain the heated chemical liquid (and heated pure water) on the periphery of the substrate W at the same temperature as the temperature of the heated chemical liquid (heated pure water) on the center of the substrate W. As a result, the temperature of the surface, to be cleaned, of the substrate W can be maintained at the same temperature.

In one embodiment, the chemical-liquid supply nozzle 66 (and the pure-water supply nozzle 68) may be a radial nozzle. Further, the chemical-liquid supply nozzles 75 and 76 and the pure-water supply nozzles 77 and 78 provided in the second cleaning module 18 may also be radial nozzles.

Figure 9:
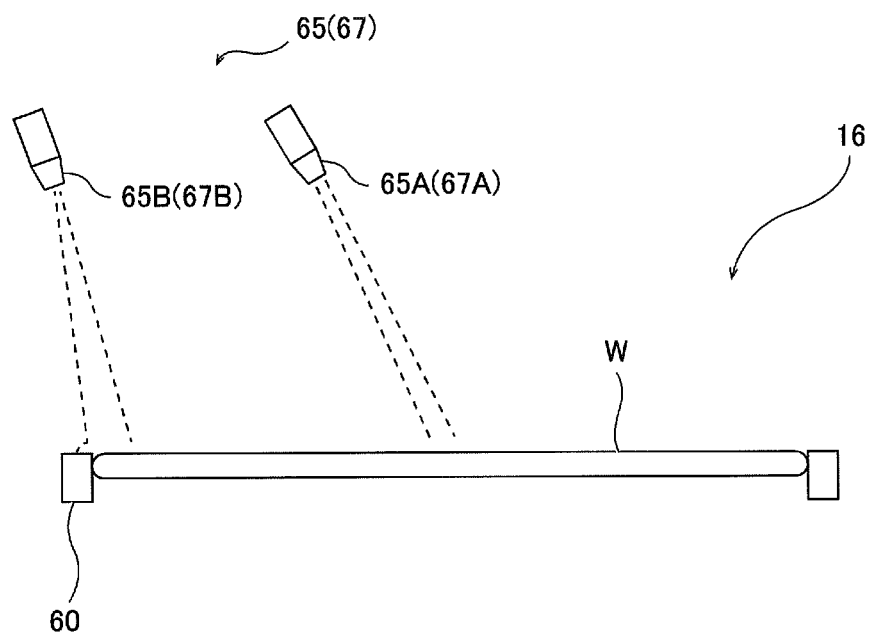
FIG. 9 is a diagram showing still another embodiment of the chemical-liquid supply nozzle.

FIG. 9 is a diagram showing still another embodiment of the chemical-liquid supply nozzle 65 (and the pure-water supply nozzle 67). As shown in FIG. 9, the chemical-liquid supply nozzle 65 (and the pure-water supply nozzle 67) may include a first chemical-liquid supply nozzle 65A (and a first pure-water supply nozzle 67A) configured to supply the diluted chemical liquid to the center of the substrate W held by the substrate holding device 60, and a second chemical-liquid supply nozzle 65B (and a second pure-water supply nozzle 67B) configured to supply the diluted chemical liquid to the periphery of the substrate W held by the substrate holding device 60.

In one embodiment, the embodiment shown in FIG. 8 and the embodiment shown in FIG. 9 may be combined. In this case, each of the first chemical-liquid supply nozzle 65A (and the first pure-water supply nozzle 67A) and the second chemical-liquid supply nozzle 65B (and the second pure-water supply nozzle 67B) is a radial nozzle.

Figure 10:
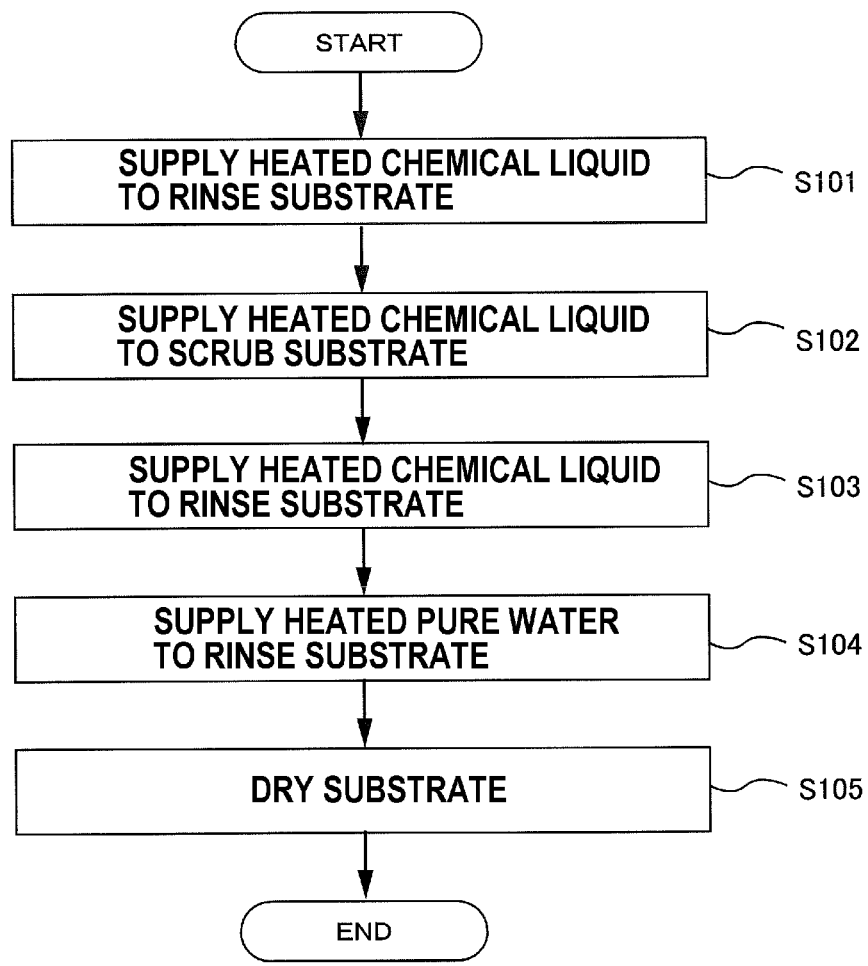
FIG. 10 is a diagram showing an embodiment of a series of cleaning and drying sequences performed by the substrate cleaning system and a drying module.

FIG. 10 is a diagram showing an embodiment of a series of cleaning and drying sequences performed by the substrate cleaning system 50 and the drying module 20. In the embodiment shown in FIG. 10, cleaning and drying sequences performed by the first cleaning module 16 and the drying module 20 will be described. In one embodiment, the cleaning sequences may be performed by the second cleaning module 18 and the drying module 20.

In one embodiment, the cleaning and drying sequences may be performed by a single module (i.e., the cleaning and drying module) which may be the cleaning module 16 or the cleaning module 18. Such a configuration can omit the transfer robot 28 (see FIG. 1), and can therefore improve the throughput of the substrate processing apparatus 1.

In one embodiment, the cleaning and drying module may have a configuration including an exhaust port arranged below the substrate W transferred therein. With such a configuration, the cleaning and drying module can form a downward flow in the cleaning and drying chamber to quickly discharge vapor (mist) of the heated pure water and the heated chemical liquid. As a result, the cleaning and drying module can prevent the vapor from reattaching to the substrate W.

As shown in step S101 of FIG. 10, first, the heated chemical liquid is supplied onto the substrate W to rinse the substrate W, and then, while the heated chemical liquid is continuously supplied, the substrate W is scrubbed by the cleaning members 61 and 62 (see step S102). Subsequently, the cleaning members 61 and 62 are separated from the substrate W, and the substrate W is rinsed again (see step S103). After the end of the step S103, the supplying of the heated chemical liquid is stopped, and the supplying of the heated pure water is started to rinse the substrate W (see step S104).

In the present embodiment, the heated pure water is supplied to rinse the substrate W to thereby remove the heated chemical liquid quickly from the substrate W. As a result, the rinse-cleaning time can be shortened. The temperature of the heated pure water supplied in the step S104 is higher than the temperature of the heated chemical liquid supplied in the step S101. After the rinse-cleaning of the substrate W with the heated pure water is terminated, the substrate W is transferred to the drying module 20 and the substrate W is dried (see step S105).

Figure 11:
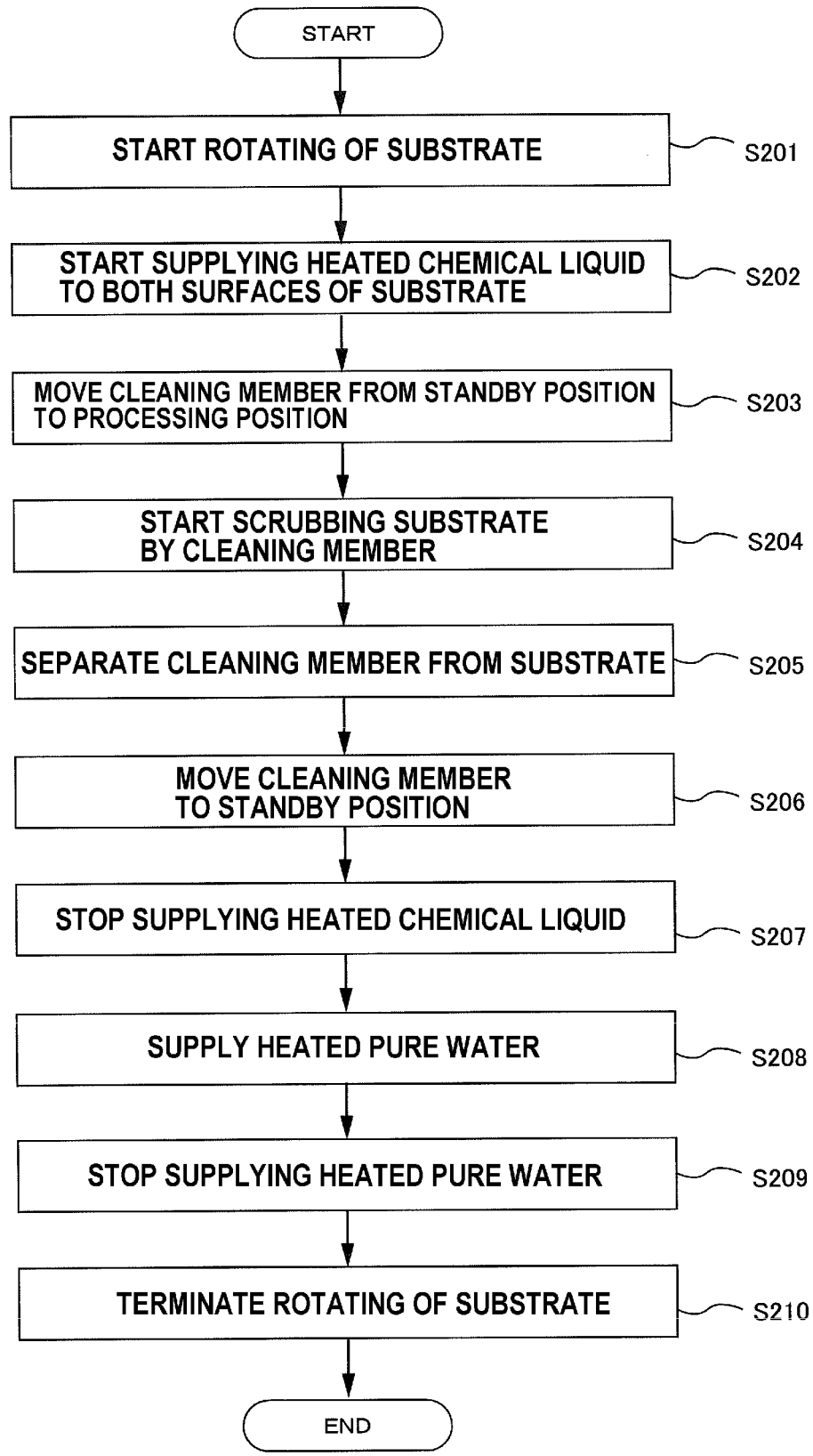
FIG. 11 is a diagram showing a cleaning process of a front surface and a back surface of the substrate performed by the first cleaning module.

FIG. 11 is a diagram showing a cleaning process of the front surface W1 and the back surface W2 of the substrate W performed by the first cleaning module 16. As shown in FIG. 11, the cleaning of the substrate W is performed as follows. First, the substrate W waiting in the transfer module 24 (see FIG. 1) is transferred to the first cleaning module 16. In one embodiment, the heated pure water may be supplied to the substrate W waiting in the transfer module 24. In this case, the transfer module 24 includes a heated pure water supply nozzle (not shown) configured to supply the heated pure water to the waiting substrate W.

The substrate holding device 60 holds the substrate W that has been transferred to the first cleaning module 16, and in this state, the rotation of the substrate W is started (see step S201). Then, the heated chemical liquid is started to be supplied to both surfaces of the substrate W (i.e., the front surface W1 and the back surface W2) through the chemical-liquid supply nozzles 65 and 66 (see step S202). In order to evenly clean the entire substrate W after the starting of the scrub-cleaning, it is desirable to preheat the substrate W such that a temperature difference is unlikely to occur in the central region and the peripheral region of the substrate W. From such a viewpoint, it is desirable to supply the chemical liquid to the front surface W1 of the substrate W and the chemical liquid to the back surface W2 of the substrate W simultaneously.

After the supplying of the heated chemical liquid is started, the cleaning members 61 and 62 are moved from predetermined standby positions to predetermined processing positions, until the cleaning members 61 and 62 are brought into contact with both surfaces of the substrate W (see step S203). The scrubbing of the substrate W with the cleaning members 61 and 62 is then started (see step S204), whereby the scrub-cleaning of the substrate W is performed.

After the scrub-cleaning of the substrate W is terminated, the cleaning members 61 and 62 are separated from the substrate W (see step S205), and the cleaning members 61 and 62 are moved to the standby positions (see step S206). Thereafter, the supplying of the heated chemical liquid is stopped (see step S207). The supplying of the heated pure water is then started (see step S208), so that the substrate W is rinsed. The step S206, the step S207, and the step S208 may be performed sequentially or simultaneously. When these steps are performed simultaneously, the substrate cleaning system 50 can achieve a time shortening of the series of cleaning sequences.

After the rinse-cleaning of the substrate W is terminated, the supplying of the heated pure water is stopped (see step S209), and the rotation of the substrate W is stopped (see step S210). The substrate W is then transferred to the drying module 20. The drying module 20 may include a nozzle configured to emit IPA vapor and a nozzle configured to emit inert gas which are arranged adjacent to a distal end of an arm which can oscillates above the substrate W. The arm oscillates above the substrate W, while the IPA vapor is supplied onto the rotating substrate W and the inert gas is supplied onto the substrate W to dry the substrate W. In this manner, the substrate W is dried in the drying module 20. The dried substrate W is then returned to the load port 12.

Figure 12:
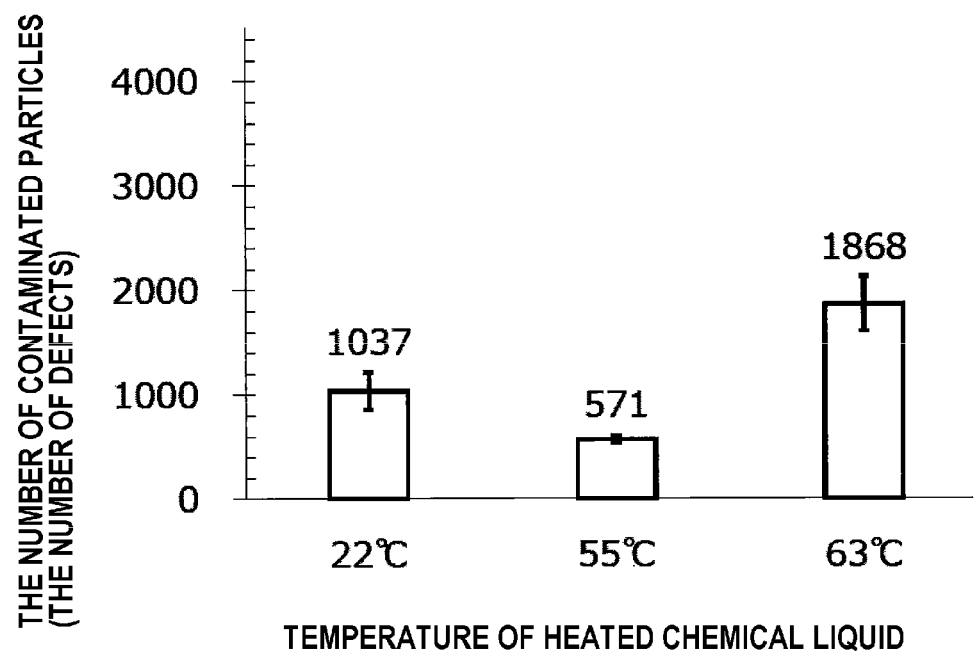
FIG. 12 is a diagram showing a cleaning effect by a structure of the cleaning module.

FIG. 12 is a diagram showing a cleaning effect achieved by the configuration of the cleaning module according to the above-described embodiment. FIG. 12 shows a comparison result of the number of defects (the number of contaminated particles) on a surface of a silicon oxide film when the cleaning sequences shown in FIG. 10 are performed on the substrate W having the silicon oxide film with particles, such as the slurry, remaining thereon immediately after the polishing process.

A temperature of heated chemical liquid in comparative example 1 was 22° C. In the comparative example 1, the chemical liquid having a normal temperature was used. A temperature of a heated chemical liquid in this embodiment was 55° C. In this embodiment, the chemical liquid having a temperature higher than a normal temperature and lower than a temperature of a glass transition point of a cleaning member (reference numeral omitted) was used. A temperature of heated chemical liquid in comparative example 2 was 63° C. In the comparative example 2, a chemical liquid having a temperature higher than a temperature of a glass transition point of a cleaning member was used.

As can be seen from FIG. 12, when the heated chemical liquid in the present embodiment was used, the number of contaminated particles present on the substrate W was much lower than the number of contaminated particles in the comparative example 1 and the number of contaminated particles in the comparative example 2. According to the embodiment discussed above, the substrate cleaning system 50 can achieve an optimum cleaning effect.

In the above-described embodiment, the roll cleaning member and the pencil cleaning member have been described as examples of the cleaning member, but the cleaning member may be a member other than the roll cleaning member and the pencil cleaning member. In one embodiment, the cleaning member may be a buffing pad.

Figure 13:
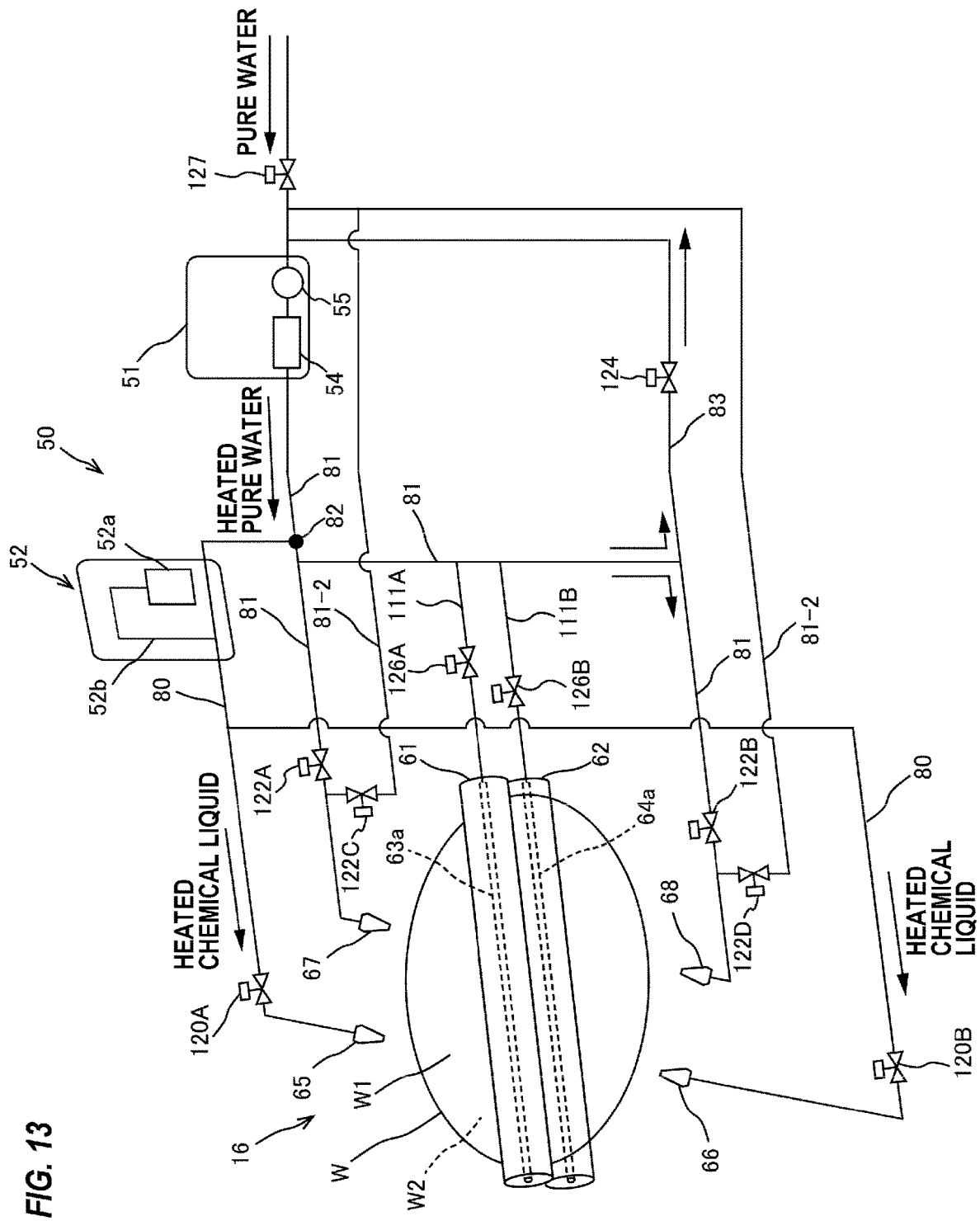
FIG. 13 is a diagram showing another embodiment of the substrate cleaning system.

FIG. 13 is a diagram showing another embodiment of the substrate cleaning system 50. Operations of the present embodiment, which will not be particularly described, are the same as those of the above-described embodiment described with reference to FIG. 2, and duplicated descriptions will be omitted.

The substrate cleaning system 50 includes heater 51 configured to heat pure water to produce heated pure water, chemical-liquid diluting module 52 configured to mix a chemical liquid and the heated pure water to produce a heated chemical liquid, and cleaning module 16 configured to clean the substrate. In one embodiment, the substrate cleaning system 50 may include second cleaning module 18 (see FIG. 4) instead of the first cleaning module 16, or may include both the first cleaning module 16 and the second cleaning module 18.

The substrate cleaning system 50 further includes chemical-liquid supply line 80 to which chemical-liquid supply nozzles 65 and 66 are coupled, pure-water supply line 81 and normal-temperature pure-water supply line 81-2 to which pure-water supply nozzles 67 and 68 are coupled, and pure-water return line 83 configured to circulate the pure water from the water supply line 81 to the heater 51. The pure-water supply line 81 is coupled to the heater 51. The chemical-liquid supply line 80 is coupled to the pure-water supply line 81 by coupling member 82, which is located downstream of the heater 51 in a flow direction of the pure water. In one embodiment, as in the embodiment described with reference to FIG. 2, the substrate cleaning system 50 may not include the normal-temperature pure-water supply line 81-2. Alternatively, the normal-temperature pure-water supply line 81-2 may be applied to the embodiment described with reference to FIG. 2.

The first cleaning module 16 includes internal pipes 63a and 64a coupled to cleaning members 61 and 62, respectively. The internal pipes 63a and 64a are arranged inside the cleaning members 61 and 62, respectively, and extend in the longitudinal direction (axial direction) of the cleaning members 61 and 62.

The substrate cleaning system 50 further includes heated-fluid delivery lines 111A and 111B coupled to the pure-water supply line 81 and the internal pipes 63a and 64a. Ends of the heated-fluid delivery lines 111A and 111B are coupled to the pure-water supply line 81, and the other ends of the heated-fluid delivery lines 111A and 111B are coupled to the internal pipes 63a and 64a, respectively, via rotary connectors (not shown). The heated pure water flowing through the pure-water supply line 81 flows through the heated-fluid delivery lines 111A and 111B into the internal pipes 63a and 64a, and is further supplied directly to insides of the cleaning members 61 and 62 through a multiple apertures of the internal pipes 63a and 64a. The heated pure water permeates throughout the entire cleaning members 61 and 62, and the heated pure water is supplied onto the front surface W1 and the back surface W2 of the substrate W which are in contact with the cleaning members 61 and 62. The details of the configuration of the first cleaning module 16 of this embodiment will be described later.

The heater 51 includes therein heating element 54 configured to heat the pure water flowing through the pure-water supply line 81 and flow-rate regulator 55 configured to regulate a flow rate of the pure water flowing through the pure-water supply line 81. The heating element 54 is, for example, an infrared lamp heater. The flow-rate regulator 55 is, for example, a diaphragm pump. The heater 51 heats the pure water flowing through the pure-water supply line 81 to a predetermined temperature. The pure water heated to the predetermined temperature by the heater 51 flows through the pure-water supply line 81. The heated pure water then branches off from the pure-water supply line 81 and flows through the chemical-liquid supply line 80 and the heated-fluid delivery lines 111A and 111B.

The chemical-liquid diluting module 52 is coupled to the chemical-liquid supply line 80. The chemical-liquid diluting module 52 includes chemical-liquid supply source 52a, chemical-liquid coupling line 52b configured to couple the chemical-liquid supply source 52a to the chemical-liquid supply line 80. The chemical-liquid diluting module 52 produces a heated chemical liquid by mixing raw chemical-liquid having a normal temperature and the heated pure water at a predetermined volume ratio to dilute the raw chemical-liquid.

The chemical-liquid supply line 80 is coupled to the chemical-liquid supply nozzles 65 and 66 at positions downstream of the chemical-liquid diluting module 52 in a flow direction of the heated chemical liquid. On-off valves 120A and 120B are attached to the chemical-liquid supply line 80. The on-off valve 120A is located between the chemical-liquid diluting module 52 and the chemical-liquid supply nozzle 65, and the on-off valve 120B is located between the chemical-liquid diluting module 52 and the chemical-liquid supply nozzle 66.

The heated-fluid delivery lines 111A and 111B are coupled to the pure-water supply line 81 at positions downstream of the heater 51 in the flow direction of the pure water. The normal-temperature pure-water supply line 81-2 is coupled to the pure-water supply line 81 at a position upstream of the heater 51 in the flow direction of the pure water. On-off valves 122A and 122B are attached to the pure-water supply line 81. The on-off valve 122A is located between the heater 51 and the pure-water supply nozzle 67, and the on-off valve 122B is located between the heater 51 and the pure-water supply nozzle 68. On-off valves 122C and 122D are attached to the normal-temperature pure-water supply line 81-2. On-off valves 126A and 126B are attached to the heated-fluid delivery lines 111A and 111B, respectively. The on-off valves 126A and 126B are located between the cleaning members 61 and 62 and the pure-water supply line 81. An on-off valve 124 is attached to the pure-water return line 83. An on-off valve 127 is attached to the pure-water supply line 81 at a position upstream of the heater 51 in the flow direction of the pure water.

Each of the on-off valves 120A, 120B, 122A, 122B, 122C, 122D, 124, 126A, 126B, and 127 is electrically connected to the controller 30 (see FIG. 1). Opening and closing operations of the on-off valves 120A, 120B, 122A, 122B, 122C, 122D, 124, 126A, 126B, and 127 can be performed based on control signals emitted from the controller 30. During standby of the cleaning, the controller 30 opens the on-off valves 124 and 127, and closes the on-off valves 120A, 120B, 122A, 122B, 122C, 122D, 126A, and 126B. With such operations, the pure water circulates through the pure-water supply line 81, the pure-water return line 83, and the heater 51. As a result, the heated pure water is maintained at a constant temperature.

The controller 30 operates the on-off valves 120A, 120B, 122A, 122B, 122C, and 122D so as to allow the pure water and/or the heated chemical liquid to be supplied onto the substrate W. When the on-off valves 122A and 122B are opened and the on-off valves 122C and 122D are closed, the heated pure water is supplied to the pure-water supply nozzles 67 and 68. When the on-off valves 122C and 122D are opened and the on-off valves 122A and 122B are closed, the pure water having a normal temperature is supplied to the pure-water supply nozzles 67 and 68. In this way, the heated pure water or the pure water having a normal temperature is selectively supplied from the pure-water supply nozzles 67 and 68 onto the substrate W. When the controller 30 opens the on-off valves 126A and 126B, the heated pure water flows through the heated-fluid delivery lines 111A and 111B and flows into the internal pipes 63a and 64a, and the heated pure water is supplied to the front surface W1 and the back surface W2 of the substrate W through the cleaning members 61 and 62.

Figure 14:
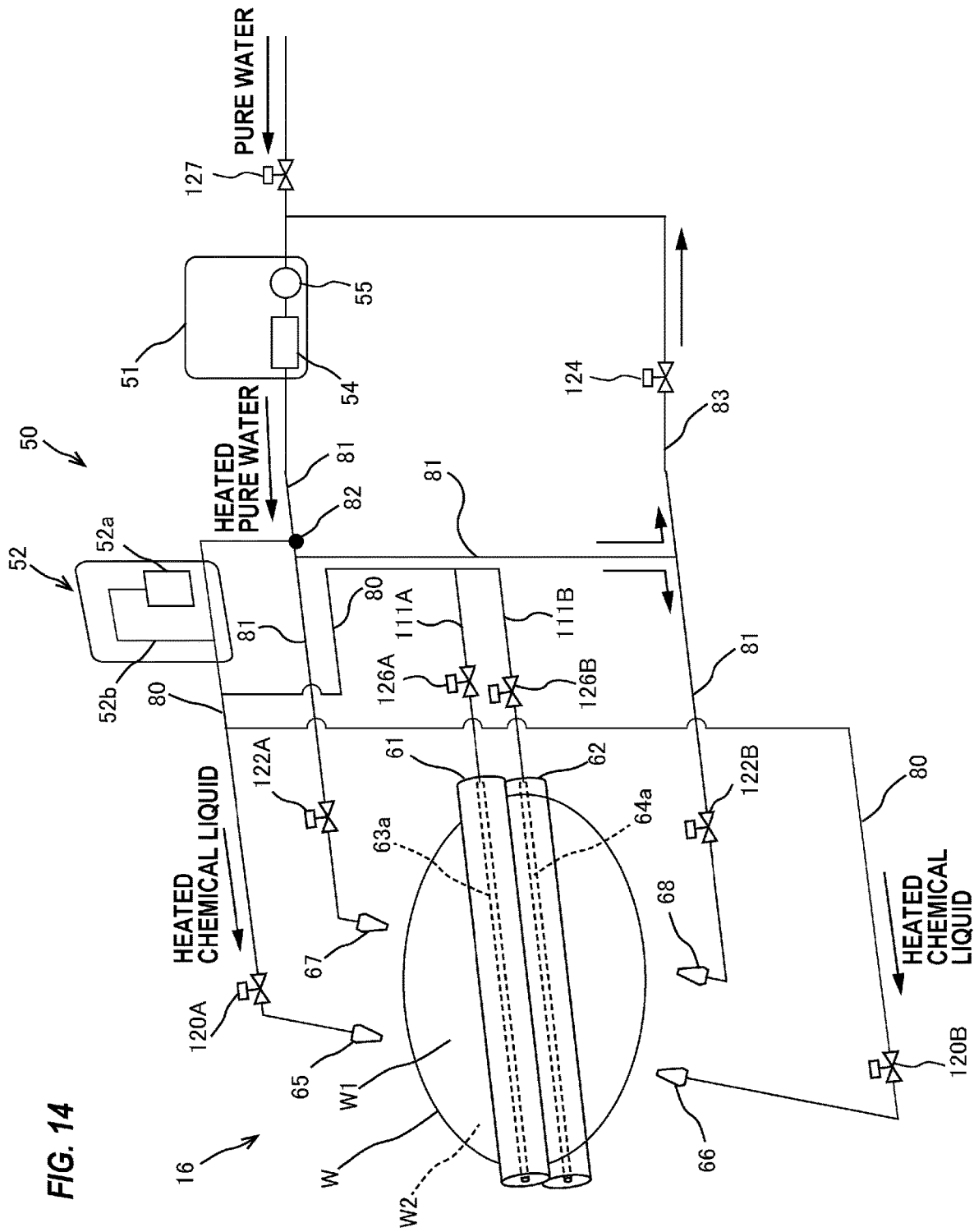
FIG. 14 is a diagram showing still another embodiment of the substrate cleaning system.

FIG. 14 is a diagram showing still another embodiment of the substrate cleaning system 50. Operations of the present embodiment, which will not be particularly described, are the same as those of the above-described embodiments described with reference to FIGS. 2 and 13, and duplicated descriptions will be omitted. In the embodiment described with reference to FIG. 13, the heated pure water is supplied as the heated fluid to the cleaning members 61 and 62, while in the embodiment shown in FIG. 14, the heated chemical liquid as the heated fluid is supplied to the cleaning members 61 and 62.

As shown in FIG. 14, heated-fluid delivery lines 111A and 111B coupled to the internal pipes 63a and 64a are coupled to the chemical-liquid supply line 80. When the controller 30 opens the on-off valves 126A and 126B, the heated chemical liquid flows through the heated-fluid delivery lines 111A and 111B and flows into the internal pipes 63a and 64a. The heated chemical liquid is further directly supplied to the interiors of the cleaning members 61 and 62 through a multiple apertures of the internal pipes 63a and 64a. The heated chemical liquid permeates throughout the entire cleaning members 61 and 62, and the heated chemical liquid is supplied onto the front surface W1 and the back surface W2 of the substrate W which are in contact with the cleaning members 61 and 62.

Figure 15:
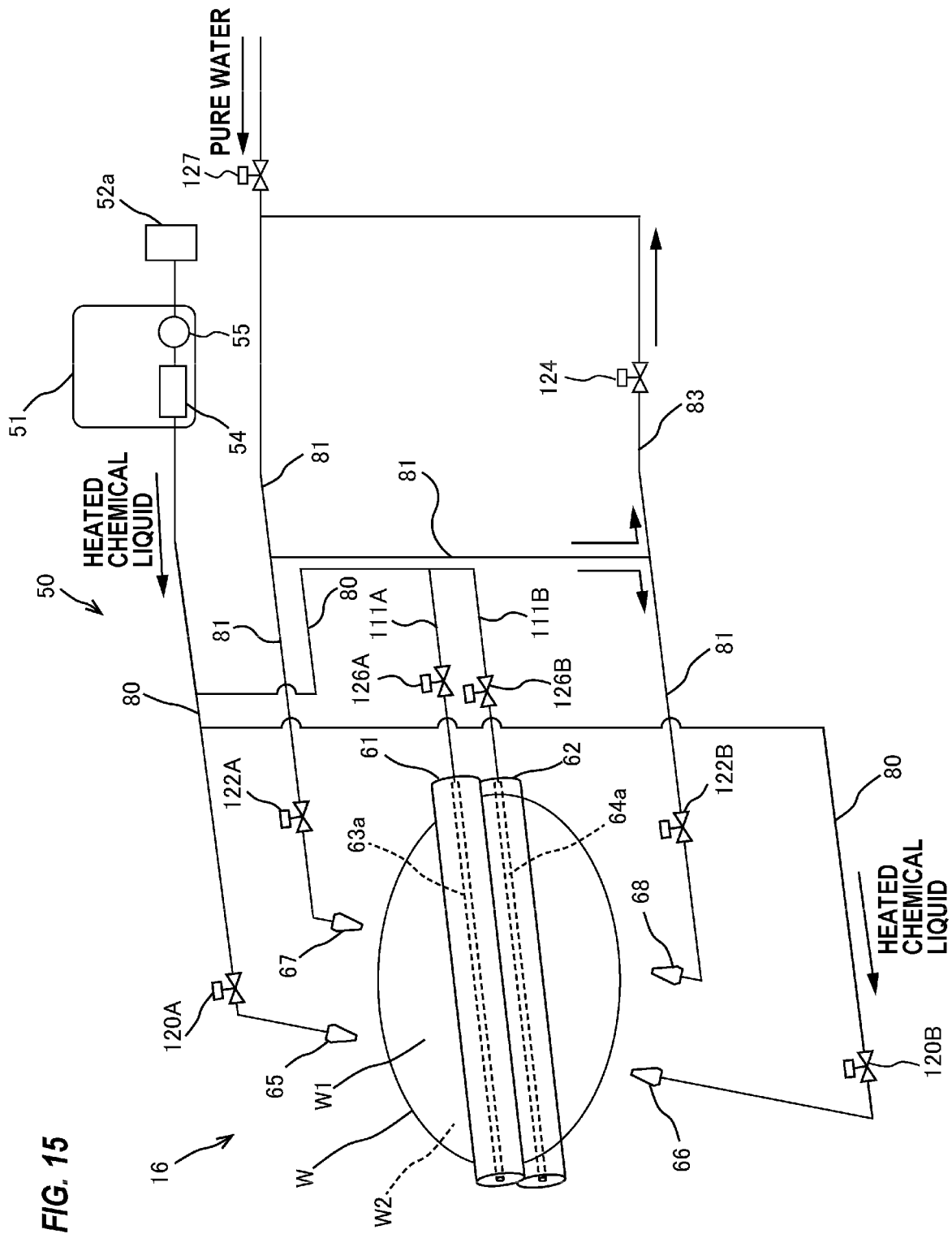
FIG. 15 is a diagram showing still another embodiment of the substrate cleaning system.

FIG. 15 is a diagram showing still another embodiment of the substrate cleaning system 50. Operations of the present embodiment, which will not be particularly described, are the same as those of the above-described embodiment described with reference to FIG. 14, and duplicated descriptions will be omitted. In the embodiment shown in FIG. 15, the heated chemical liquid is produced by directly heating the chemical liquid with the heater 51. The chemical liquid is supplied from the chemical-liquid supply source 52a to the chemical-liquid supply line 80 to which the chemical-liquid supply nozzles 65 and 66 are coupled. The heater 51 is coupled to the chemical-liquid supply line 80 and heats the chemical liquid flowing through the chemical-liquid supply line 80 to a predetermined temperature. The heated chemical liquid that has been heated to the predetermined temperature by the heater 51 flows through the chemical-liquid supply line 80. The heated chemical liquid then branches off from the chemical-liquid supply line 80 and flows through the heated-fluid delivery lines 111A and 111B.

The pure water is flowing through the pure-water supply line 81, and the pure-water supply nozzles 67 and 68 are coupled to the pure-water supply line 81. In the present embodiment, the pure water having a normal temperature is supplied from the pure-water supply nozzles 67 and 68, while the pure-water supply line 81 may be provided with a heater that produces heated pure water, which may be supplied from the pure-water supply nozzles 67 and 68. Alternatively, as with the embodiment described with reference to FIG. 13, the heated pure water or the pure water having a normal temperature may be selectively supplied from the pure-water supply nozzles 67 and 68. Further, the above-described configuration that the heated chemical liquid is produced by directly heating the chemical liquid by the heater 51 may be applied to the embodiment described with reference to FIG. 2.

Figure 16:
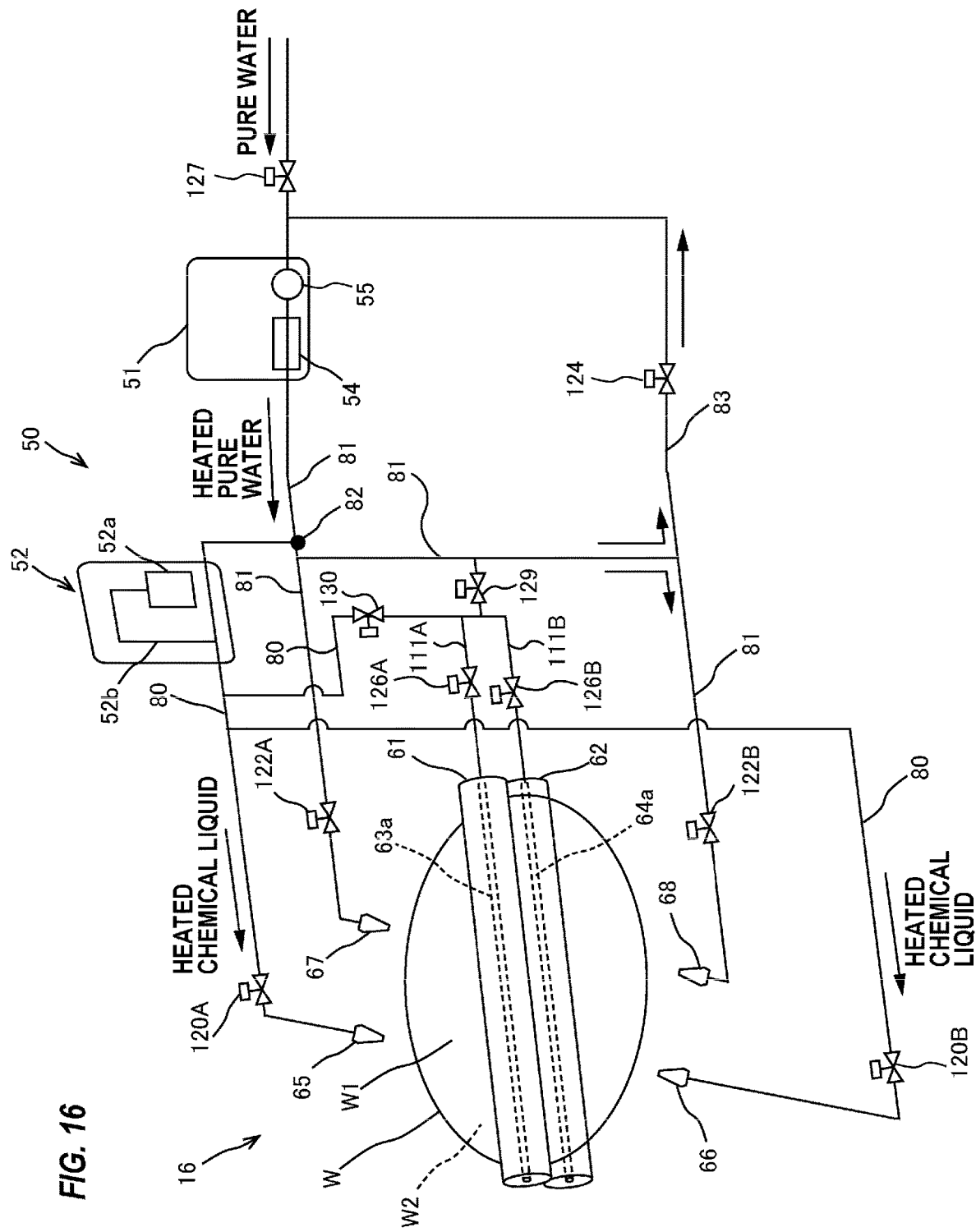
FIG. 16 is a diagram showing still another embodiment of the substrate cleaning system.

FIG. 16 is a diagram showing still another embodiment of the substrate cleaning system 50. Operations of the present embodiment, which will not be particularly described, are the same as those of the above-described embodiments described with reference to FIGS. 2 and 14, and duplicated descriptions will be omitted. In the embodiment shown in FIG. 16, the internal pipes 63a and 64a are coupled to both the pure-water supply line 81 and the chemical-liquid supply line 80 via the heated-fluid delivery lines 111A and 111B. A first switching valve 129 is disposed between the heated-fluid delivery lines 111A and 111B and the pure-water supply line 81, and a second switching valve 130 is disposed between the heated-fluid delivery lines 111A and 111B and the chemical-liquid supply line 80. The first switching valve 129 and the second switching valve 130 are electrically connected to the controller 30 (see FIG. 1), and opening and closing operations of the first switching valve 129 and the second switching valve 130 are controlled by the controller 30.

When the first switching valve 129 is opened and the second switching valve 130 is closed, the pure-water supply line 81 communicates with the internal pipes 63a and 64a through the first switching valve 129 and the heated-fluid delivery lines 111A and 111B. Therefore, the heated pure water flows from the pure-water supply line 81 through the first switching valve 129 and the heated-fluid delivery lines 111A and 111B to the internal pipes 63a and 64a. When the second switching valve 130 is opened and the first switching valve 129 is closed, the chemical-liquid supply line 80 communicates with the internal pipes 63a and 64a through the second switching valve 130 and the heated-fluid delivery lines 111A and 111B. Therefore, the heated chemical liquid flows from the chemical-liquid supply line 80 through the second switching valve 130 and the heated-fluid delivery lines 111A and 111B to the internal pipes 63a and 64a. In this way, the internal pipes 63a and 64a coupled to the heated-fluid delivery lines 111A and 111B selectively communicate with the pure-water supply line 81 or the chemical-liquid supply line 80.

Figure 17:
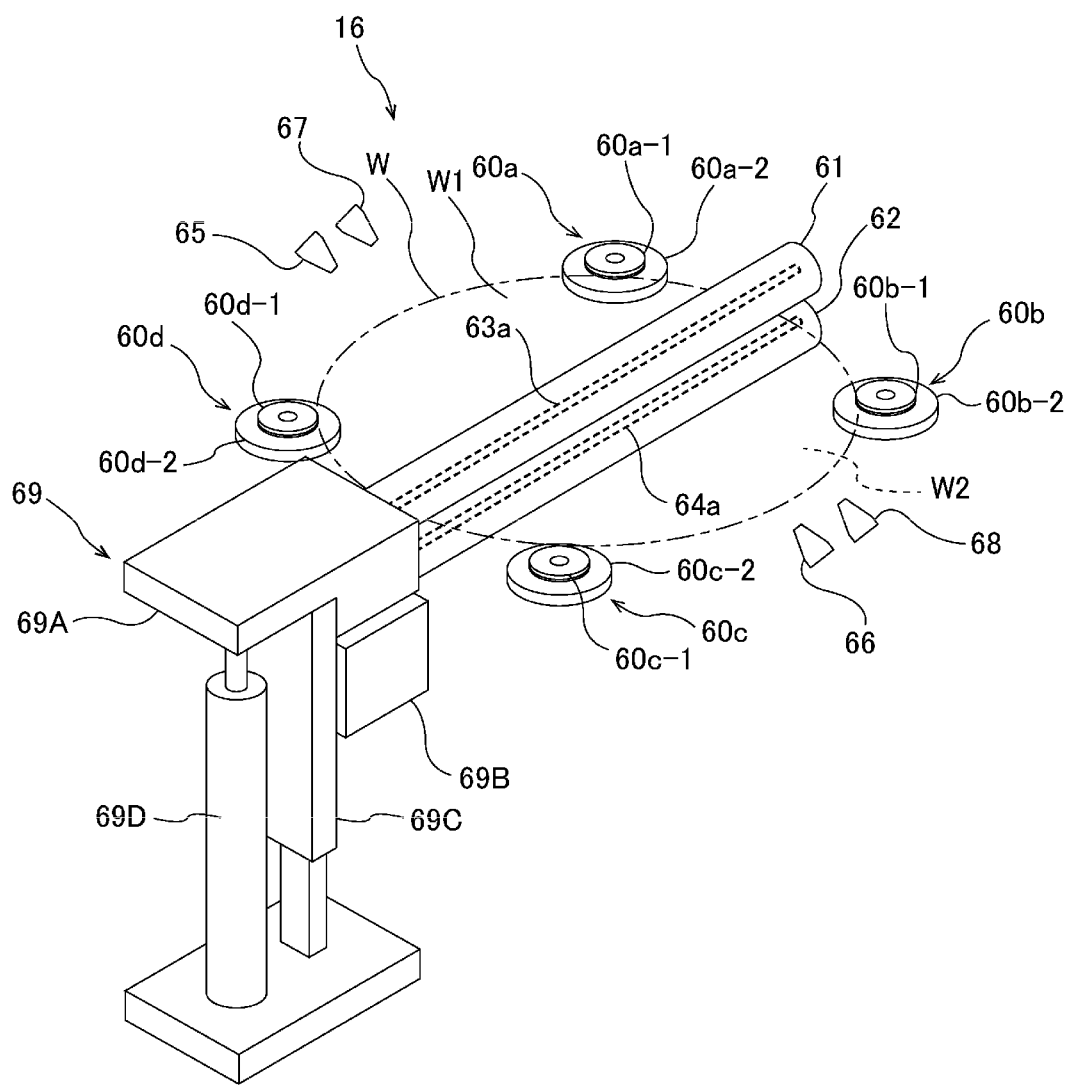
FIG. 17 is a perspective view showing an embodiment of the cleaning module shown in FIGS. 13 to 16.

FIG. 17 is a perspective view showing an embodiment of the first cleaning module 16 shown in FIGS. 13 to 16, and FIG. 18 is a cross-sectional view showing a part of the first cleaning module 16 shown in FIG. 17. Operations of the present embodiment, which will not be particularly described, are the same as those of the above-described embodiment described with reference to FIG. 3, and duplicated descriptions will be omitted. As shown in FIG. 17, the first cleaning module 16 includes rollers 60a to 60d configured to hold and rotate the substrate W, cleaning members 61 and 62 configured to scrub the substrate W, rotating mechanism 69 configured to rotate the cleaning members 61 and 62, the chemical-liquid supply nozzles 65 and 66 configured to supply the heated chemical liquid to the front surface W1 and the back surface W2 of the substrate W, and the pure-water supply nozzle 67 and 68 configured to supply the heated pure water to the front surface W1 and the back surface W2 of the substrate W.

The rollers 60a to 60d is movable in directions closer to and away from each other by a not-shown drive mechanism (e.g., an air cylinder). The rollers 60a to 60d have a two-steps structure constituted by holding portions 60a-1 to 60d-1 and shoulder portions (supporting portions) 60a-2 to 60d-2. The diameter of the shoulder portions 60a-2 to 60d-2 is larger than the diameter of the holding portions 60a-1 to 60d-1, and the holding portions 60a-1 to 60d-1 are located on the shoulder portions 60a-2 to 60d-2, respectively.

When the substrate W is to be held, the substrate W is first placed on the shoulder portions 60a-2 to 60d-2. Next, the rollers 60a to 60d are moved in directions closer to each other until the periphery of the substrate W is held by the holding portions 60a-1 to 60d-1. At least one of the rollers 60a to 60d is configured to be rotated by a not-shown rotating mechanism (e.g., a spindle), whereby the substrate W rotates while being held by the rollers 60a to 60d.

Figure 18:
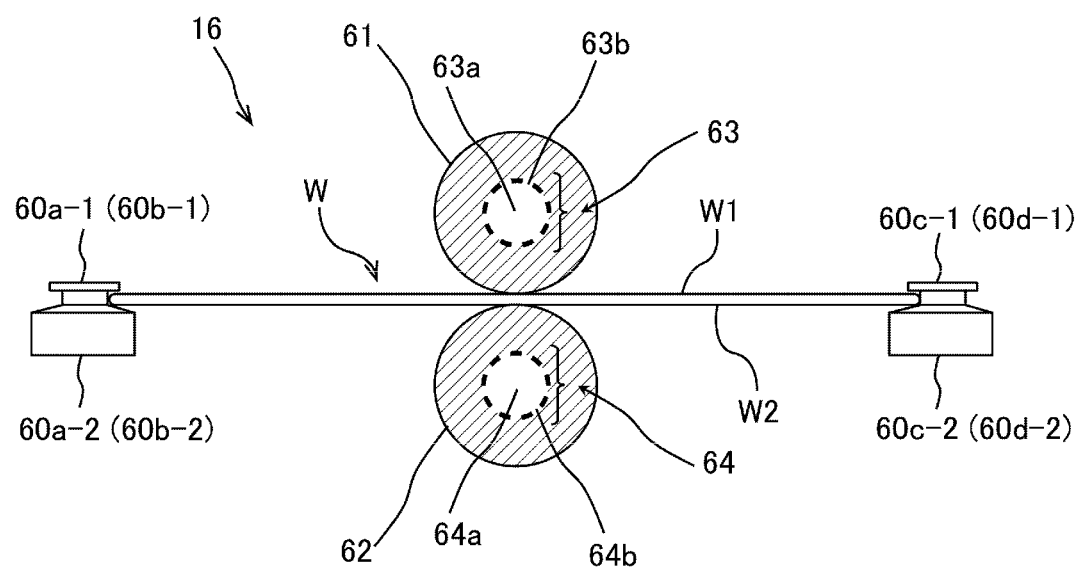
FIG. 18 is a cross-sectional view showing a part of the first cleaning module shown in FIG. 17.

As shown in FIG. 18, upper surfaces of the shoulder portions 60a-2 to 60d-2 have tapered shapes inclined downward toward the outside thereof. During holding of the substrate W with the holding portions 60a-1 to 60d-1, the substrate W is kept in non-contact with the shoulder portions 60a-2 to 60d-2.

Returning back to FIG. 17, the chemical-liquid supply nozzle 65 is a front-surface-side chemical-liquid supply nozzle configured to supply the diluted chemical liquid to the front surface W1 of the substrate W. The chemical-liquid supply nozzle 66 is a back-surface-side chemical-liquid supply nozzle configured to supply the diluted chemical liquid to the back surface W2 of the substrate W. Similarly, the pure-water supply nozzle 67 is a front-surface-side pure-water supply nozzle configured to supply the pure water to the front surface W1 of the substrate W. The pure-water supply nozzle 68 is a back-surface-side pure-water supply nozzle configured to supply the pure water to the back surface W2 of the substrate W.

Each of the cleaning members 61 and 62 is a sponge member having a cylindrical shape and having a longitudinal length longer than the diameter of the substrate W. Each of the cleaning members 61 and 62 is arranged such that the direction of the central axis thereof is parallel to the surface of the substrate W (i.e., the front surface W1 and the back surface W2). Hereinafter, the cleaning member 61 may be referred to as an upper roll cleaning member 61, and the cleaning member 62 may be referred to as a lower roll cleaning member 62.

During loading and unloading of the substrate W, the upper roll cleaning member 61 and the lower roll cleaning member 62 are located away from each other. During cleaning of the substrate W, the upper roll cleaning member 61 and the lower roll cleaning member 62 move in directions closer to each other and come into contact with the front surface W1 and the back surface W2 of the substrate W. Each of the upper roll cleaning member 61 and the lower roll cleaning member 62 is rotated by the rotating mechanism 69 to scrub the entire surface of the rotating substrate W (scrub-cleaning).

The rotating mechanism 69 includes an upper-cleaning-member rotating mechanism 69A, a lower-cleaning-member rotating mechanism 69B, a guide rail 69C, and an elevating mechanism 69D. The upper-cleaning-member rotating mechanism 69A is attached to a guide rail 69C configured to define a vertical movement of the upper-cleaning-member rotating mechanism 69A, and is supported by the elevating mechanism 69D. The upper roll cleaning member 61 is movable in the vertical direction by the elevating mechanism 69D. The elevating mechanism 69D is, for example, a motor-driven mechanism using a ball screw or an air cylinder. Similarly, the lower-cleaning-member rotating mechanism 69B is also supported by a guide rail and an elevating mechanism (not shown), and the lower roll cleaning member 62 is movable in the vertical direction.

As shown in FIG. 18, the first cleaning module 16 includes shafts 63 and 64 arranged inside the cleaning members 61 and 62, respectively. The shaft 63 is a rotation shaft of the cleaning member 61, and the shaft 64 is a rotation shaft of the cleaning member 62. The shaft 63 includes the internal pipe 63a having multiple apertures 63b, and the shaft 64 includes the internal pipe 64a having multiple apertures 64b. The heated fluid constituted by the heated pure water or the heated chemical liquid is supplied to the internal pipes 63a and 64a from the heated-fluid delivery lines 111A and 111B (see FIGS. 13 to 16).

The multiple apertures 63b and 64b are arranged in entire outer peripheral surfaces of the internal pipes 63a and 64a, and communicate with interiors of the internal pipes 63a and 64a, respectively. The internal pipes 63a and 64a are longer than the diameter of the substrate W, and the multiple apertures 63b and 64b are arranged across the substrate W. The apertures 63b and 64b face the cleaning members 61 and 62. More specifically, the apertures 63b and 64b face inner surfaces of the cleaning members 61 and 62. Therefore, the heated fluid constituted by the heated pure water or the heated chemical liquid supplied through the heated-fluid delivery lines 111A and 111B flows into the internal pipes 63a and 64a and is then directly supplied to the interiors of the cleaning members 61 and 62 from the apertures 63b and 64b. The heated fluid permeates throughout the entire cleaning members 61 and 62, further exudes to the outsides of the cleaning members 61 and 62 to be supplied to the entire front surface W1 and back surface W2 of the substrate W.

According to the present embodiment, the cleaning members 61 and 62, to which the heated fluid is directly supplied, are in contact with not only the central portion but also the periphery of the substrate W. Therefore, the first cleaning module 16 can perform the scrub-cleaning of the substrate W at a desired temperature without lowering the liquid temperature at the periphery of the substrate W due to a cooling action associated with the rotational movement of the substrate W. As a result, a uniformity of the liquid temperature over the entire surface of the substrate W during the cleaning process can be improved, and a stable removal effect for particulate contamination, molecular contamination, and metal element contamination can be achieved.

Figure 19:
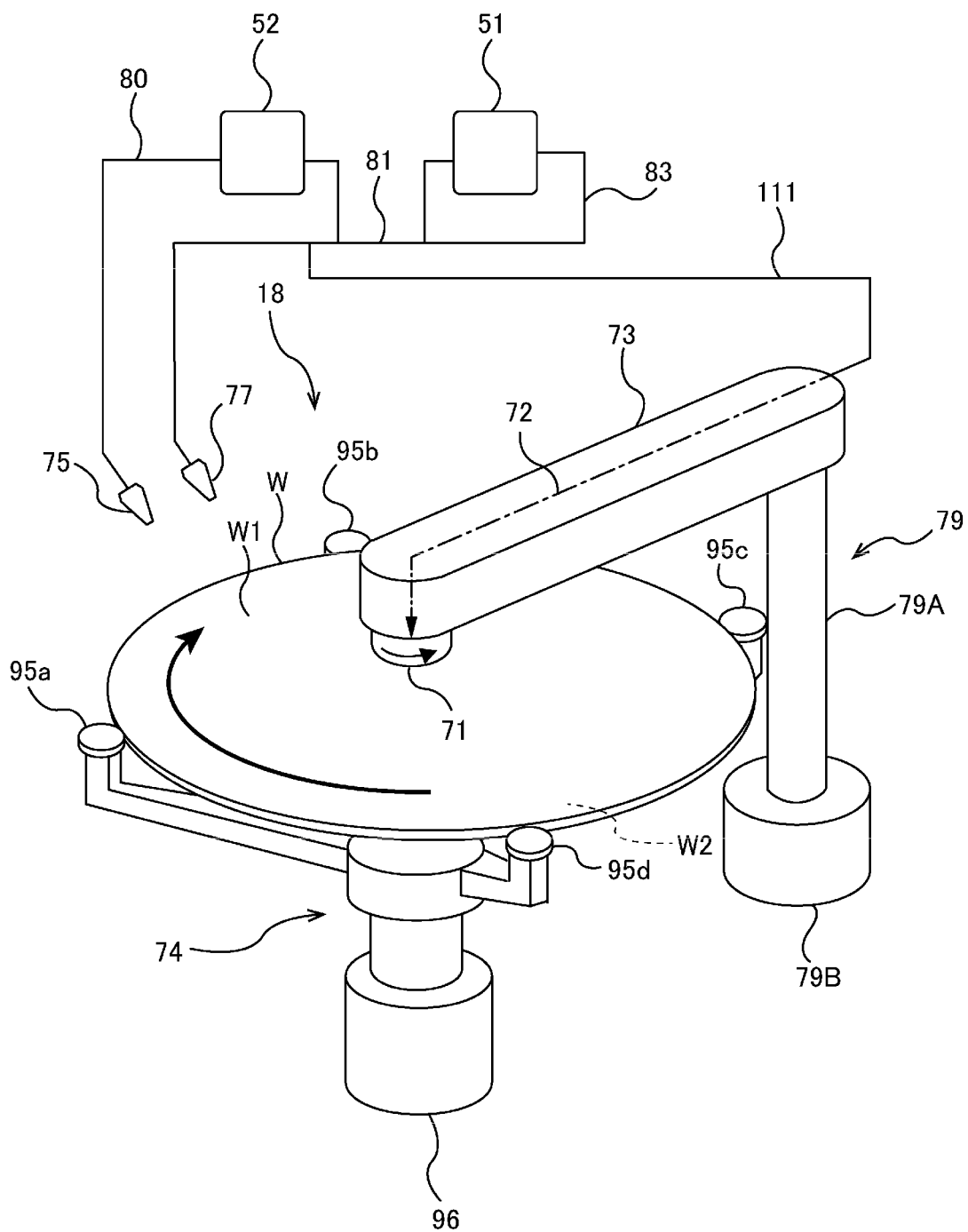
FIG. 19 is a perspective view showing another embodiment of the second cleaning module.
Figure 20:
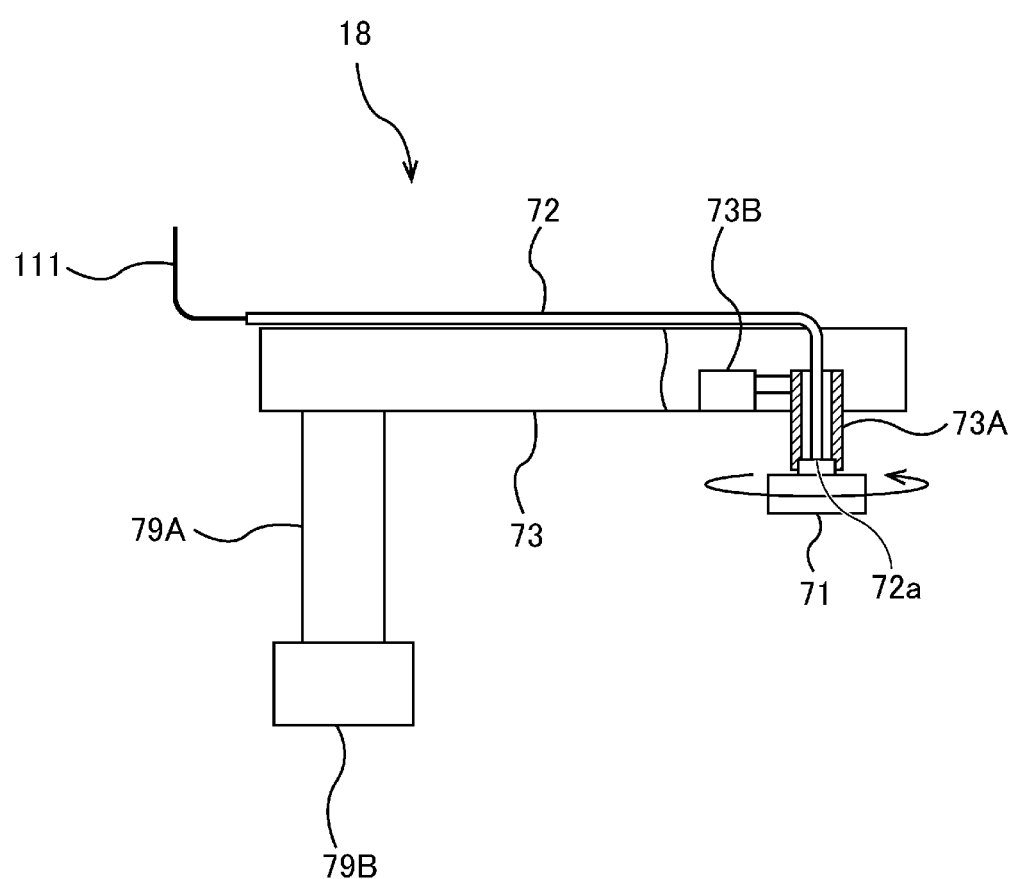
FIG. 20 is a cross-sectional view showing a part of the second cleaning module shown in FIG. 19.

FIG. 19 is a perspective view showing another embodiment of the second cleaning module 18, and FIG. 20 is a cross-sectional view showing a part of the second cleaning module 18 shown in FIG. 19. Operations of the present embodiment, which will not be particularly described, are the same as those of the above-described embodiments described with reference to FIGS. 4 and 13, and duplicated descriptions will be omitted. Further, for simplification of the drawings, the illustration of each valve shown in FIG. 13 is omitted.

As shown in FIG. 19, the second cleaning module 18 includes substrate holding device 74 configured to hold and rotate the substrate W, cleaning member 71 configured to scrub the substrate W, arm 73 coupled to the cleaning member 71, moving mechanism 79 configured to move the cleaning member 71, chemical-liquid supply nozzle 75 configured to supply the heated chemical liquid to the front surface W1 of the substrate W, and pure-water supply nozzle 77 configured to supply the heated pure water to the front surface W1 of the substrate W. Although not shown in FIG. 19, the second cleaning module 18 may include nozzles configured to supply the heated chemical liquid and the heated pure water to the back surface W2 of the substrate W.

The substrate holding device 74 includes chucks 95a to 95d configured to hold the periphery of the substrate W, and a motor 96 coupled to the chucks 95a to 95d. The chucks 95a to 95d are, for example, spring-type clamp mechanisms. The chucks 95a to 95d hold the substrate W, and the substrate W is rotated about its axis by driving the motor 96.

The cleaning member 71 is a sponge member having a pencil shape and being configured to contact the front surface W1 of the substrate W while rotating around the central axis of the cleaning member 71 to scrub the substrate W. Hereinafter, the cleaning member 71 may be referred to as a pencil cleaning member 71. An upper part of the pencil cleaning member 71 is coupled to an internal pipe 72, and the internal pipe 72 is coupled to a heated-fluid delivery line 111. The heated-fluid delivery line 111 is coupled to the pure-water supply line 81. In one embodiment, the heated-fluid delivery line 111 may be coupled to the chemical-liquid supply line 80 as described in the embodiments shown in FIGS. 14 and 15, or the heated-fluid delivery line 111 may be coupled to both the pure-water supply line 81 and the chemical-liquid supply line 80 as described in the embodiment shown in FIG. 16.

The arm 73 is arranged above the substrate W and is coupled to the moving mechanism 79. The moving mechanism 79 includes a pivot shaft 79A and a cleaning-member moving mechanism 79B. One end of the arm 73 is coupled to the pivot shaft 79A, and the other end of the arm 73 is coupled to the pencil cleaning member 71. The direction of the central axis of the pencil cleaning member 71 is perpendicular to the front surface W1 (or the back surface W2) of the substrate W.

The pivot shaft 79A is coupled to the cleaning-member moving mechanism 79B configured to cause the arm 73 to pivot. The cleaning-member moving mechanism 79B is configured to cause the arm 73 to pivot in a plane parallel to the substrate W by rotating the pivot shaft 79A with a predetermined angle. The cleaning member 71 moves in the radial direction of the substrate W by the pivot movement of the arm 73. The pivot shaft 79A is movable in the vertical direction by an elevating mechanism (not shown), so that the cleaning member 71 is pressed against the front surface W1 of the substrate W at a predetermined pressure to scrub the substrate W (scrub cleaning). An example of the elevating mechanism includes a motor-driven mechanism using a ball screw or an air cylinder. In one embodiment, the moving mechanism 79 may perform the same operations as those of the oscillating mechanism described with reference to FIG. 4.

As shown in FIG. 20, the pencil cleaning member 71 is fixed to a lower end of a supporting shaft 73A extending in the direction perpendicular to the substrate W, i.e., in the vertical direction. The supporting shaft 73A has a hollow structure and is coupled to a cleaning-member rotating mechanism 73B mounted inside the arm 73. The pencil cleaning member 71 is rotated about the supporting shaft 73A by the cleaning-member rotating mechanism 73B and moves in the radial direction of the substrate W by the rotation of the arm 73 to thereby scrub the front surface W1 of the rotating substrate W.

The pencil cleaning member 71 is coupled to the internal pipe 72 extending through the inside of the supporting shaft 73A. One end of the internal pipe 72 is coupled to the heated-fluid delivery line 111, and the other end of the internal pipe 72 is coupled to the upper part of the pencil cleaning member 71. The internal pipe 72 has an aperture 72a facing the upper part of the pencil cleaning member 71. The heated pure water as the heated fluid is directly supplied to the pencil cleaning member 71 through the aperture 72a of the internal pipe 72.

The heated pure water permeates throughout the entire pencil cleaning member 71, and exudes to the outside of the pencil cleaning member 71 to be supplied to the front surface W1 of the substrate W. In one embodiment, the heated-fluid delivery line 111 may be coupled to the chemical-liquid supply line 80 (see FIG. 19) and the heated chemical liquid may be supplied directly to the pencil cleaning member 71 through the internal pipe 72.

According to the present embodiment, the pencil cleaning member 71, to which the heated pure water or the heated chemical liquid is directly supplied, contacts not only the central portion but also the periphery of the substrate W. Therefore, the pencil cleaning member 71 can perform the scrub cleaning while maintaining a desired temperature without lowering the liquid temperature near the periphery of the substrate W due to a cooling action associated with the rotational movement of the substrate W. As a result, the second cleaning module 18 can improve a uniformity of the liquid temperature over the entire surface of the substrate W during the cleaning process, and a stable removal effect for particulate contamination, molecular contamination, and metal element contamination can be achieved.

Figure 21:
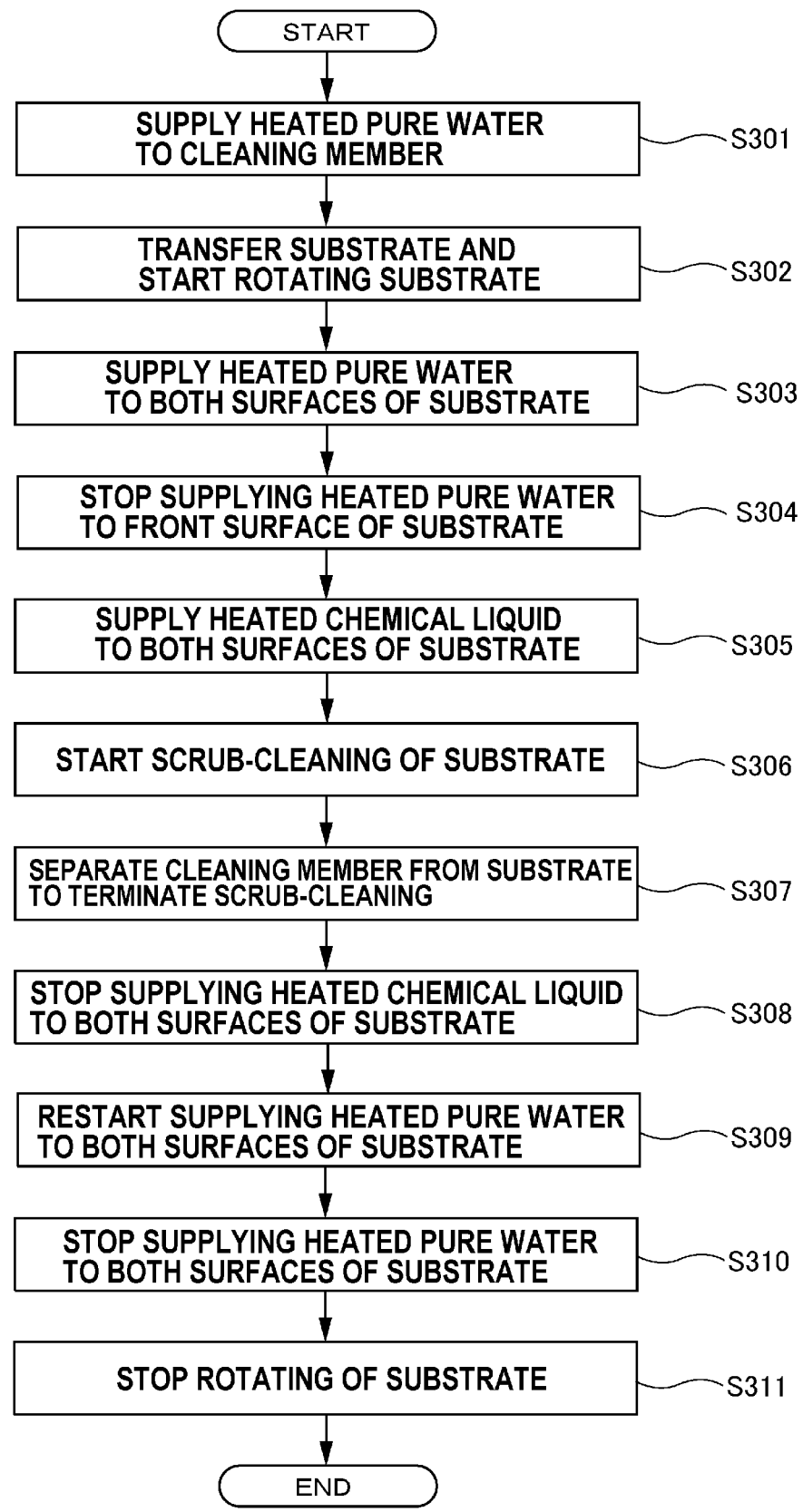
FIG. 21 is a flowchart showing a cleaning sequence of the substrate performed by the first cleaning module shown in FIG. 13.

FIG. 21 is a flowchart showing an embodiment of a cleaning sequence of the substrate W performed by the first cleaning module 16 shown in FIG. 13. In a standby state of the first cleaning module 16 in which the processing of the substrate W is not performed, the heater 51 is operated in advance and the temperature of the heated pure water in the pure-water supply line 81 is maintained at 60° C. In the chemical-liquid supply line 80, the temperature of the heated chemical liquid is maintained at 54° C. by the chemical-liquid diluting module 52, which produces the heated chemical liquid by mixing the raw chemical-liquid having a normal temperature and the heated pure water at a predetermined volume ratio to dilute the raw chemical-liquid with the heated pure water.

First, the on-off valves 120A and 120B coupled to the chemical-liquid supply nozzles 65 and 66 and the on-off valves 122A and 122B coupled to the pure-water supply nozzles 67 and 68 are closed, and the on-off valves 126A and 126B coupled to the internal pipes 63a and 64a are opened (see step S301). Since the heated pure water is supplied to the cleaning members 61 and 62 through the internal pipes 63a and 64a and exudes to the outside of the cleaning members 61 and 62, the cleaning members 61 and 62 are clean and heated. During the cleaning process of the substrate, the on-off valves 126A and 126B are opened at all times (i.e., the heated pure water is supplied continuously to the cleaning members 61 and 62).

The substrate W is transferred to the first cleaning module 16, and the periphery of the substrate W is placed on the shoulder portions 60a-2 to 60d-2. The holding portions 60a-1 to 60d-1 hold the substrate W by moving the rollers 60a to 60d in the directions closer to the center of the substrate W. When the rollers 60a to 60d rotate, the rotation of the substrate W is started (see step S302).

The on-off valves 122A and 122B are opened to start the supplying of the heated pure water from the pure-water supply nozzles 67 and 68 onto both surfaces of the substrate W (i.e., the front surface W1 and the back surface W2) (see step S303). The on-off valve 122A is closed to stop the supplying of the heated pure water from the pure-water supply nozzle 67 onto the front surface W1 of the substrate W (see step S304). The on-off valves 120A and 120B are opened to start the supplying of the heated chemical liquid from the chemical-liquid supply nozzles 65 and 66 onto both surfaces of the substrate W (see step S305). Since the substrate W transferred to the first cleaning module 16 has a normal temperature, the surface temperature of the substrate W is raised in advance by supplying the heated pure water in the step S303. This operation can prevent the temperature drop of the chemical liquid when the heated chemical liquid is supplied in the step S305.

The cleaning members 61 and 62 are moved from predetermined standby positions to predetermined processing positions by the elevating mechanism 69D and the elevating mechanism (not shown). While the cleaning members 61 and 62 are rotated by the rotating mechanisms 69A and 69B, the cleaning members 61 and 62 are pressed against both surfaces of the substrate W to start the scrub-cleaning of the substrate W (see step S306). At this time, since the heated pure water is supplied through the cleaning members 61 and 62 onto the front surface W1 and the back surface W2 of the substrate W in contact with the cleaning members 61 and 62, the first cleaning module 16 can scrub-clean the substrate W while maintaining the liquid temperature on the periphery of the substrate W.

After a predetermined time has elapsed, the cleaning members 61 and 62 are separated from the front surface W1 and the back surface W2 of the substrate W by the elevating mechanism 69D and the elevating mechanism (not shown) to terminate the scrub-cleaning (see step S307). The on-off valves 120A and 120B are then closed to stop the supplying of the heated chemical liquid from the chemical-liquid supply nozzles 65 and 66 onto both surfaces of the substrate W (see step S308). The on-off valve 122A is opened to restart the supplying of the heated pure water from the pure-water supply nozzle 67 onto the front surface W1 of the substrate W (see step S309). Subsequently, the on-off valves 122A and 122B are closed to stop the supplying of the heated pure water from the pure-water supply nozzles 67 and 68 onto both surfaces of the substrate W (see step S310). In the step 309, instead of the on-off valve 122A, the on-off valve 122C may be opened to supply the pure water having a normal temperature from the pure-water supply nozzle 67 onto the front surface W1 of the substrate W.

The rotations of the rollers 60a to 60d are stopped, so that the rotation of the substrate W is stopped (see step S311). The rollers 60a to 60d are moved in the directions away from the center of the substrate W, so that the holding portions 60a-1 to 60d-1 are separated from the substrate W, and the periphery of the substrate W is placed on the shoulder portions 60a-2 to 60d-2 again. The cleaned substrate W is then removed from the first cleaning module 16 by the transfer robot (not shown). The on-off valves 126A and 126B are maintained opened, so that the cleaning members 61 and 62 are kept clean and heated at all times.

In the above embodiment, the heated pure water as the heated fluid is supplied to the cleaning members 61 and 62, while in one embodiment, the heated chemical liquid as the heated fluid may be supplied to the cleaning members 61 and 62 as in the embodiments described with reference to FIGS. 14 and 15. In another embodiment, the heated chemical liquid as the heated fluid is supplied to the cleaning members 61 and 62 during the scrubbing of the substrate W, and the heated pure water as the heated fluid may be supplied to the cleaning members 61 and 62 after the scrubbing of the substrate W. For example, in the step of supplying the chemical liquid from the chemical-liquid supply nozzles 65 and 66 onto both surfaces of the substrate W (see the steps S305 to S308), the heated chemical liquid may be supplied to the cleaning members 61 and 62, and in the other steps, the heated pure water may be supplied to the cleaning members 61 and 62.

Although a description is omitted, the second cleaning module 18 described with reference to FIG. 19 also scrubs the substrate W according to a cleaning sequence basically the same as the cleaning sequence shown in FIG. 21.

Figure 22:
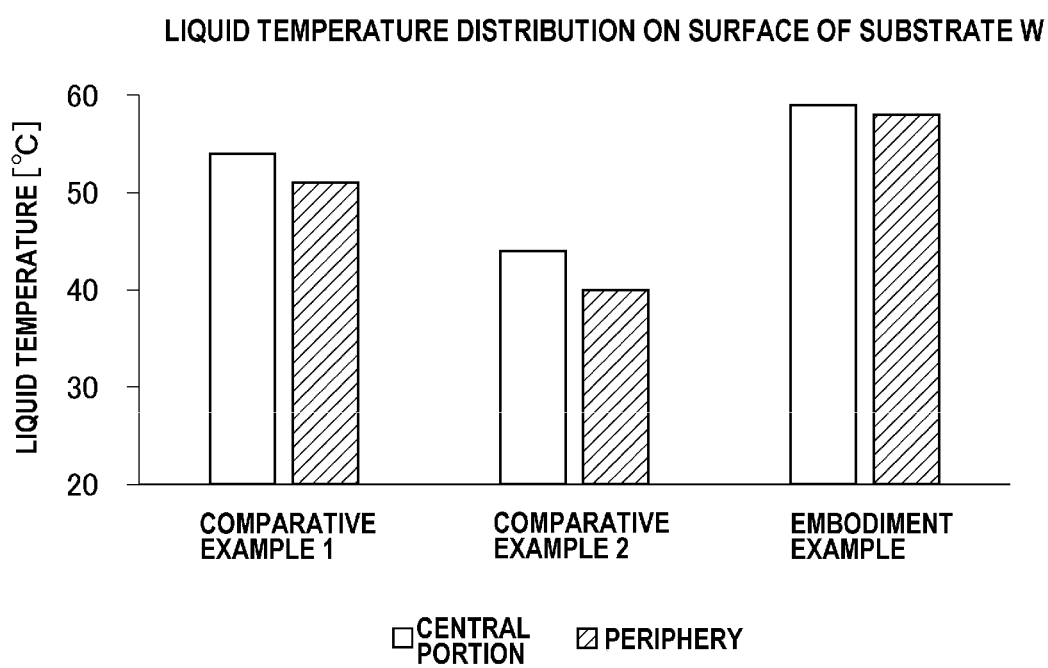
FIG. 22 is a diagram showing an effect of liquid temperature uniformity on the front surface of the substrate according to one embodiment of the substrate cleaning system.

FIG. 22 is a diagram showing an effect of liquid temperature uniformity on the front surface W1 of the substrate W according to an embodiment of the substrate cleaning system. Specifically, FIG. 22 is a diagram showing a measurement result of the liquid temperature in the central part and the periphery of the front surface W1 of the substrate W during performing the cleaning sequence shown in FIG. 21. The measuring method is, for example, measuring of radiant heat using a thermography camera.

Comparative example 1 shows a measurement result when the on-off valves 120A and 120B were opened to supply the heated chemical liquid from the chemical-liquid supply nozzles 65 and 66, the on-off valve 122B was opened to supply the heated pure water from the pure-water supply nozzle 68, and the on-off valves 122A, 126A, and 126B were closed. Specifically, the heated fluid was not supplied to the cleaning members 61 and 62.

Comparative example 2 shows a measurement result when the on-off valves 120A and 120B were opened to supply the heated chemical liquid from the chemical-liquid supply nozzles 65 and 66, the on-off valve 122B was opened to supply the heated pure water from the pure-water supply nozzle 68, the on-off valve 122A was closed, and the unheated pure water was supplied from the internal pipes 63a and 64a. Specifically, the pure water having a normal temperature was supplied to the cleaning members 61 and 62.

Embodiment example shows a measurement result when the on-off valves 120A and 120B were opened to supply the heated chemical liquid from the chemical-liquid supply nozzles 65 and 66, the on-off valve 122B was opened to supply the heated pure water from the pure-water supply nozzle 68, the on-off valve 122A was closed, and the heated pure water was supplied from the internal pipes 63a and 64a. Specifically, the heated pure water was supplied to the cleaning members 61 and 62.

As can be seen from FIG. 22, when the heated pure water was supplied from the cleaning members 61 and 62 in the present embodiment, the decrease in the liquid temperature from the temperature of the heated pure water of 60° C. on the front surface W1 of the substrate W was suppressed. In addition, the temperature difference between the central portion and the periphery of the substrate W was also suppressed to be small. Therefore, according to the present embodiment, the first cleaning module 16 can not only raise the temperature of the substrate W, but also improve a uniformity of the liquid temperature over the entire surface of the substrate W, and a stable removal effect for contamination of the substrate W can be achieved.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims.

INDUSTRIAL APPLICABILITY

The present invention is applicable to a substrate cleaning system and a substrate cleaning method for cleaning a substrate.

REFERENCE SIGNS LIST 1 substrate processing apparatus
2 polishing section
4 cleaning section
10 housing
12 load port
14A~14D polishing module
16 first cleaning module
18 second cleaning module
20 drying module
22 first transfer robot
24 transfer module
26 second transfer robot
28 third transfer robot
30 controller
30a memory
30b processer
50 substrate cleaning system
51 heater
52 chemical-liquid diluting module
52a chemical-liquid supply source
52b chemical-liquid coupling line
54 heating element
55 flow-rate regulator
60 substrate holding device
60a~60d roller
60a-1~60d-1 holding portion
60a-2~60d-2 shoulder portion (supporting portion)

61, 62 cleaning member (roll cleaning member)
63, 64 shaft
63a, 64a internal pipe
63b, 64b aperture
65, 66 chemical-liquid supply nozzle
65A first chemical-liquid supply nozzle
65B second chemical-liquid supply nozzle
67, 68 pure-water supply nozzle
67A first pure-water supply nozzle
67B second pure-water supply nozzle
69 rotating mechanism
69A upper-cleaning-member rotating mechanism
69B lower-cleaning-member rotating mechanism
69C guide rail
69D elevating mechanism
71 cleaning member (pencil cleaning member)
72 internal pipe
73 arm
73A supporting shaft
73B cleaning-member rotating mechanism
74 substrate holding device
75, 76 chemical-liquid supply nozzle
77, 78 pure-water supply nozzle
79 oscillating mechanism (moving mechanism)
79A pivot shaft
79B cleaning-member moving mechanism
80 chemical-liquid supply line
80A first chemical-liquid branch line
80B second chemical-liquid branch line
81 pure-water supply line
81A first pure-water branch line
81B second pure-water branch line
81-2 normal-temperature pure-water supply line
82 coupling member
83 pure-water return line
83A first return branch line
83B second return branch line
84 flow-rate sensor
85 temperature sensor
86, 87, 88, 90, 91 filter
95a~95d chuck
96 motor
100 heat insulating member
101 heater
102 liquid-splash prevention cup
105 heater
111, 111A, 111B heated-fluid delivery line
120, 120A, 120B, 121, 122, 122A, 122B, 122C, 122D, 123, 124, 125, 126A, 126B, 127 on-off valve
129 first switching valve
130 second switching valve
W substrate
W1 front surface
W2 back surface

The invention claimed is:

1. A substrate cleaning system comprising:
a heater configured to heat pure water;
a chemical-liquid diluting module configured to mix chemical liquid and the pure water heated by the heater at a predetermined volume ratio to produce diluted chemical liquid;
a chemical-liquid supply line coupled to the heater and the chemical-liquid diluting module; and
a cleaning module configured to clean a substrate,
wherein the chemical-liquid diluting module includes a chemical-liquid supply source and a chemical-liquid coupling line that couples the chemical-liquid supply source to the chemical-liquid supply line,
wherein the cleaning module comprises:
a substrate holding device configured to hold the substrate;
a cleaning member configured to contact the substrate and scrub the substrate;
a chemical-liquid supply nozzle configured to supply the diluted chemical liquid to the substrate; and
a pure-water supply nozzle configured to supply the heated pure water to the substrate,
wherein a temperature of the diluted chemical liquid is determined to be higher than a normal temperature thereof and lower than a glass transition point of the cleaning member, and
the cleaning member is configured to scrub the substrate while the diluted chemical liquid having the determined temperature is supplied to the substrate.

2. The substrate cleaning system according to claim 1, further comprising:
a pure-water supply line to which the pure-water supply nozzle is coupled,
wherein the chemical-liquid supply line is coupled to the chemical-liquid supply nozzle,
wherein the heater is coupled to the pure-water supply line and arranged upstream of a coupling member in a flow direction of the pure water, the coupling member being configured to couple the chemical-liquid supply line to the pure-water supply line.

3. The substrate cleaning system according to claim 1, wherein a temperature of the pure water supplied from the pure-water supply nozzle is higher than the temperature of the diluted chemical liquid supplied from the chemical-liquid supply nozzle.

4. The substrate cleaning system according to claim 1, wherein the chemical-liquid supply nozzle comprises a radial nozzle configured to supply the diluted chemical liquid to a region from a center of the substrate to a periphery of the substrate held by the substrate holding device.

5. The substrate cleaning system according to claim 1, wherein the chemical-liquid supply nozzle comprises:
a first chemical-liquid supply nozzle configured to supply the diluted chemical liquid to a center of the substrate held by the substrate holding device; and
a second chemical-liquid supply nozzle configured to supply the diluted chemical liquid to a periphery of the substrate held by the substrate holding device.

6. The substrate cleaning system according to claim 1, wherein the chemical-liquid supply nozzle comprises:
a front-surface-side chemical-liquid supply nozzle configured to supply the diluted chemical liquid to a front surface of the substrate held by the substrate holding device; and
a back-surface-side chemical-liquid supply nozzle configured to supply the diluted chemical liquid to a back surface of the substrate held by the substrate holding device.

7. A substrate cleaning system comprising:
a heater configured to heat pure water;
a chemical-liquid diluting module configured to mix chemical liquid and the pure water heated by the heater at a predetermined volume ratio to form diluted chemical liquid;
a cleaning module configured to clean a substrate,
wherein the cleaning module comprises:
a substrate holding device configured to hold the substrate;

a cleaning member configured to contact the substrate and scrub the substrate;
a chemical-liquid supply nozzle configured to supply the diluted chemical liquid to the substrate;
a pure-water supply nozzle configured to supply the heated pure water to the substrate;
a first filter arranged adjacent to the chemical-liquid supply nozzle and configured to capture foreign matter flowing through the chemical-liquid supply line; and
a second filter arranged adjacent to the pure-water supply nozzle and configured to capture foreign matter flowing through the pure-water supply line;
wherein a temperature of the diluted chemical liguid is determined to be higher than a normal temperature thereof and lower than a glass transition point of the cleaning member, and
the cleaning member is configured to scrub the substrate while the diluted chemical liquid having the determined temperature is supplied to the substrate.

8. A substrate cleaning system comprising:
a heater configured to heat pure water;
a chemical-liquid diluting module configured to mix chemical liquid and the pure water heated by the heater at a predetermined volume ratio to form diluted chemical liquid;
a cleaning module configured to clean a substrate,
wherein the cleaning module comprises:
a substrate holding device configured to hold the substrate;
a cleaning member configured to contact the substrate and scrub the substrate;
a chemical-liquid supply nozzle configured to supply the diluted chemical liquid to the substrate;
a pure-water supply nozzle configured to supply the heated pure water to the substrate; and
a heating device arranged adjacent to a periphery of the substrate held by the substrate holding device,
wherein the heating device is arranged to heat the diluted chemical liquid present on the periphery of the substrate.

9. A substrate cleaning system comprising:
a chemical-liquid diluting module configured to mix chemical liquid and pure water at a predetermined volume ratio;
a cleaning module configured to clean a substrate using a cleaning member configured to contact the substrate and using diluted chemical liquid supplied by the chemical-liquid diluting module;
a flow-rate regulator configured to regulate flow rate of the diluted chemical liquid;
a heater configured to heat at least one of the chemical liquid, the pure water, and the diluted chemical liquid; and
a controller configured to control the heater and the flow-rate regulator such that a temperature of the diluted chemical liquid is higher than a normal temperature and lower than a glass transition point of the cleaning member when the diluted chemical liquid is supplied to the cleaning module.

10. A substrate cleaning system comprising:
a heater configured to heat pure water to produce heated pure water;
a chemical-liquid diluting module configured to mix chemical liquid and the heated pure water to produce heated chemical liquid; and
a cleaning module configured to clean a substrate,
wherein the cleaning module comprises:
a substrate holding device configured to hold the substrate;
a cleaning member configured to contact the substrate and scrub the substrate;
a chemical-liquid supply nozzle configured to supply the heated chemical liquid to the substrate;
a pure-water supply nozzle configured to supply pure water to the substrate; and
an internal pipe coupled to the cleaning member and configured to supply heated fluid, which is the heated pure water or the heated chemical liquid, to the cleaning member, the internal pipe communicating with at least one of the heater and the chemical-liquid diluting module,
wherein the internal pipe is arranged inside the cleaning member and extends in a longitudinal direction of the cleaning member.

11. The substrate cleaning system according to claim 10, wherein the internal pipe has at least one aperture facing the cleaning member.

12. The substrate cleaning system according to claim 10, further comprising:
a chemical-liquid supply line to which the chemical-liquid supply nozzle is coupled;
a pure-water supply line to which the pure-water supply nozzle is coupled; and
a heated-fluid delivery line coupled to the internal pipe,
wherein the heater is coupled to the pure-water supply line, and
the heated-fluid delivery line is coupled to at least one of the pure-water supply line and the chemical-liquid supply line.

13. The substrate cleaning system according to claim 10, wherein the cleaning member is a roll cleaning member having a cylindrical shape, and a longitudinal length of the cleaning member is longer than a diameter of the substrate.

14. The substrate cleaning system according to claim 10, wherein
the cleaning member is a pencil cleaning member having a pencil shape, and
the internal pipe is coupled to an upper part of the pencil cleaning member.

15. A substrate cleaning system comprising:
a heater configured to heat chemical liquid to produce heated chemical liquid; and
a cleaning module configured to clean a substrate,
wherein the cleaning module comprises:
a substrate holding device configured to hold the substrate;
a cleaning member configured to contact the substrate and scrub the substrate;
a chemical-liquid supply nozzle configured to supply the heated chemical liquid to the substrate;
a pure-water supply nozzle configured to supply pure water to the substrate; and
an internal pipe coupled to the cleaning member and configured to supply the heated chemical liquid to the cleaning member, the internal pipe communicating with the heater,
wherein the internal pipe is arranged inside the cleaning member and extrends in a longitudinal direction of the cleaning member.

16. The substrate cleaning system according to claim 15, wherein the internal pipe has at least one aperture facing the cleaning member.

17. The substrate cleaning system according to claim 15, further comprising:

a chemical-liquid supply line to which the chemical-liquid supply nozzle is coupled;

a pure-water supply line to which the pure-water supply nozzle is coupled; and a heated-fluid delivery line coupled to the internal pipe, the heater is coupled to the chemical-liquid supply line, and the heated-fluid delivery line is coupled to the chemical-liquid supply line.

18. The substrate cleaning system according to claim 15, wherein the cleaning member is a roll cleaning member having a cylindrical shape, and a longitudinal length of the cleaning member is longer than a diameter of the substrate.

19. The substrate cleaning system according to claim 15, wherein the cleaning member is a pencil cleaning member having a pencil shape, and the internal pipe is coupled to an upper part of the pencil cleaning member.

* * * * *